US011482559B2

(12) United States Patent
Maekawa

(10) Patent No.: US 11,482,559 B2
(45) Date of Patent: Oct. 25, 2022

(54) OPTICAL SEMICONDUCTOR DEVICE AND METHOD OF ASSEMBLING OPTICAL SEMICONDUCTOR DEVICE

(71) Applicant: SUMITOMO ELECTRIC DEVICE INNOVATIONS, INC., Yokohama (JP)

(72) Inventor: Kyohei Maekawa, Kanagawa (JP)

(73) Assignee: SUMITOMO ELECTRIC DEVICE INNOVATIONS, INC., Yokohama (JP)

( * ) Notice: Subject to any disclaimer, the term of this patent is extended or adjusted under 35 U.S.C. 154(b) by 139 days.

(21) Appl. No.: 17/025,576

(22) Filed: Sep. 18, 2020

(65) Prior Publication Data

US 2021/0098523 A1 Apr. 1, 2021

(30) Foreign Application Priority Data

Sep. 27, 2019 (JP) .............................. JP2019-177420

(51) Int. Cl.
*H01L 27/146* (2006.01)
*H01L 31/16* (2006.01)
*H01L 31/18* (2006.01)

(52) U.S. Cl.
CPC .... *H01L 27/14643* (2013.01); *H01L 27/1469* (2013.01); *H01L 31/16* (2013.01); *H01L 31/18* (2013.01)

(58) Field of Classification Search
CPC ........... H01L 27/14643; H01L 27/1469; H01L 31/16; H01L 31/18; H01L 31/02325; H01L 25/167; H01L 21/50; H01L 23/49838; H01L 24/85; G02B 6/421; G02B 6/4204

USPC ......................................................... 257/443
See application file for complete search history.

(56) References Cited

U.S. PATENT DOCUMENTS

| 5,023,447 A * | 6/1991 | Masuko ................. G02B 6/421 |
| | | 257/E31.118 |
| 5,610,395 A | 3/1997 | Nishiyama |
| 5,953,617 A * | 9/1999 | Lee ........................ H01L 27/305 |
| | | 438/312 |
| 6,847,665 B2 * | 1/2005 | Yamada .............. H01S 5/02325 |
| | | 372/38.08 |

(Continued)

FOREIGN PATENT DOCUMENTS

JP 2000-183369 A 6/2000

*Primary Examiner* — Duy T Nguyen
(74) *Attorney, Agent, or Firm* — Oliff PLC

(57) ABSTRACT

An optical semiconductor device includes a semiconductor light receiving element, a capacitor, and a carrier. The carrier has a mounting surface on which the semiconductor light receiving element and the capacitor are mounted. The optical semiconductor device includes a first conductive pattern including a first mounting area and a first bonding pad, a second conductive pattern including a second mounting area and a third mounting area, and a third conductive pattern including a second bonding pad. The first mounting area is connected to a first electrode of the semiconductor light receiving element. The second mounting area is connected to a second electrode of the semiconductor light receiving element. The third mounting area is connected to one electrode of the capacitor. The conductive patterns are separated from each other. The other electrode of the capacitor is electrically connected to the third conductive pattern via a wire.

5 Claims, 19 Drawing Sheets

(56) References Cited

U.S. PATENT DOCUMENTS

2006/0057760 A1\* 3/2006 Yi ................... H01L 27/14687
                                                    438/57
2008/0217515 A1\* 9/2008 Fujii ........................ G01J 1/46
                                                    250/208.2

\* cited by examiner

*Fig.*6
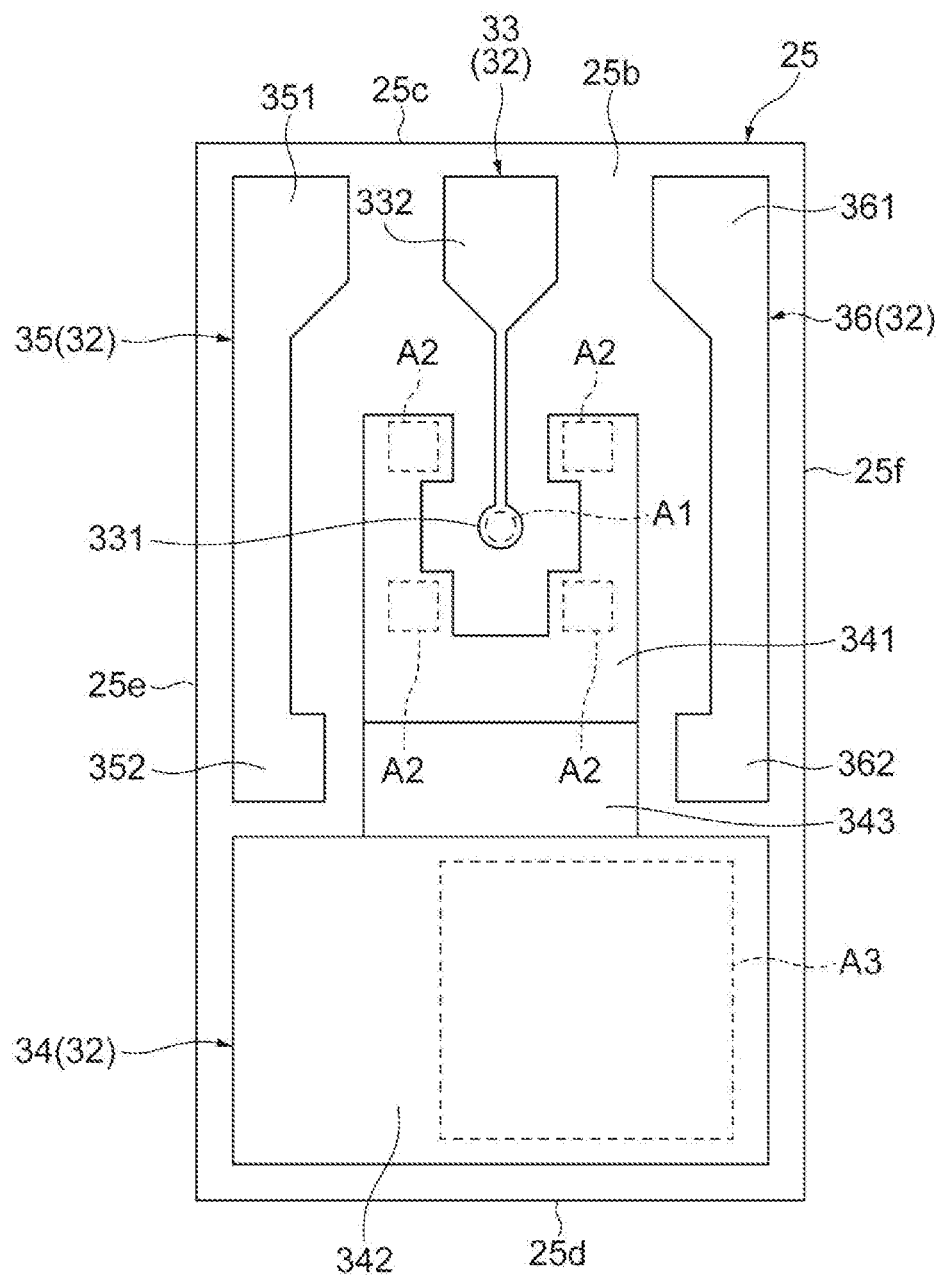

OPTICAL SEMICONDUCTOR DEVICE AND METHOD OF ASSEMBLING OPTICAL SEMICONDUCTOR DEVICE

CROSS-REFERENCE TO RELATED APPLICATION

Priority is claimed on Japanese Patent Application No. 2019-177420, filed Sep. 27, 2019, the content of which is incorporated herein by reference.

TECHNICAL FIELD

The present disclosure relates to an optical semiconductor device and a method of assembling an optical semiconductor device.

BACKGROUND

JP2000-183369A discloses a coaxial type light receiving module that is attached to an optical fiber. The light receiving module includes a package, a photodiode provided on an upper surface of the package, and a preamplifier IC provided on the upper surface of the package. The photodiode and the preamplifier IC are electrically connected to a power supply terminal and a signal output terminal fixed to the package via a bonding wire.

SUMMARY

An optical semiconductor device of the present disclosure includes a semiconductor light receiving element, a capacitor, a carrier, a first conductive pattern, a second conductive pattern, and a third conductive pattern. The semiconductor light receiving element has a first electrode and a second electrode which has a conductivity type opposite to that of the first electrode. The capacitor has one electrode and an other electrode. The carrier has a mounting surface on which the semiconductor light receiving element and the capacitor are mounted. The carrier is made of a dielectric. The first conductive pattern, the second conductive pattern, and the third conductive pattern are provided on the mounting surface of the carrier. The first conductive pattern includes a first mounting area which is connected to the first electrode. The first conductive pattern includes a first bonding pad provided on one end of the mounting surface. The second conductive pattern includes a second mounting area which is connected to the second electrode. The second conductive pattern includes a third mounting area which is provided on an other end of the mounting surface and is connected to the one electrode of the capacitor. The third conductive pattern includes a second bonding pad which is provided on the one end of the mounting surface side by side with the first bonding pad. The first conductive pattern, the second conductive pattern, and the third conductive pattern are separated from each other. The other electrode of the capacitor and the third conductive pattern are electrically connected to each other via a wire.

BRIEF DESCRIPTION OF THE DRAWINGS

The foregoing and other purposes, aspects, and advantages will be better understood from the following detailed description of embodiments of the disclosure with reference to the drawings, in which:

FIG. 6 is a plan view of a mounting surface of a carrier.

DETAILED DESCRIPTION

Figure 1:
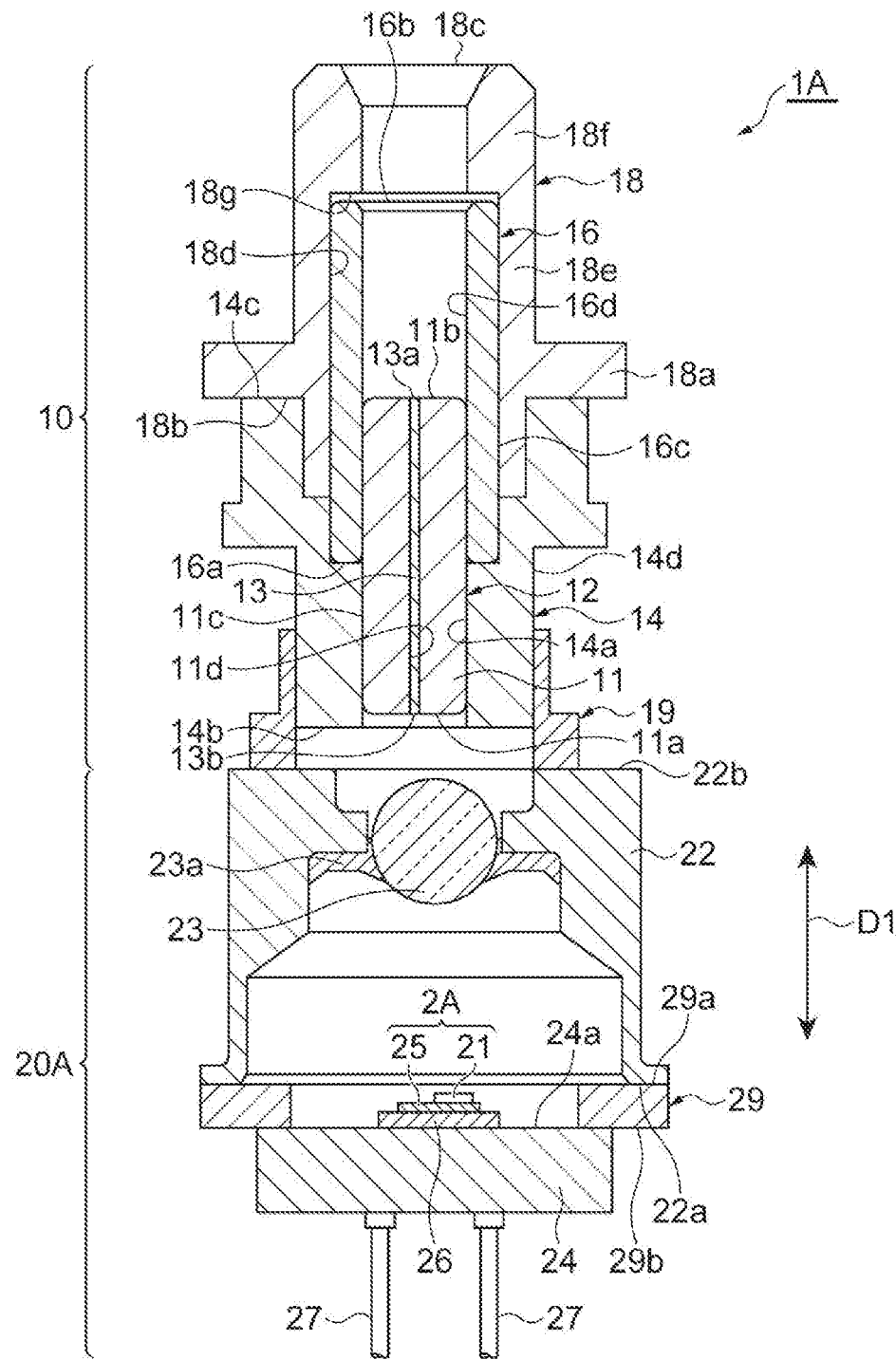
FIG. 1 is a cross-sectional view showing a configuration of a light receiving module according to an embodiment.

Problems to be Solved by the Present Disclosure

To convert the intensity of light into an electric signal, a semiconductor light receiving element such as a photodiode is used in, for example, a light receiving module for optical communication. In a case in which the size of the semiconductor light receiving element is extremely small, the semiconductor light receiving element is mounted on a carrier having a conductive film on its surface (chip on carrier:

CoC), and a test such as burn-in is performed in that state. The conductive film includes one conductive pattern which is connected to one electrode of the semiconductor light receiving element and another conductive pattern which is connected to the other electrode of the semiconductor light receiving element. During the test, one probe is brought into contact with one conductive pattern, another probe is brought into contact with the other conductive pattern, and a test voltage is applied between these probes.

However, in recent years, the miniaturization of carriers has been progressing along with the miniaturization of light receiving modules. Therefore, the size of the conductive pattern provided on the surface of the carrier is also small, and a gap between the conductive patterns is also narrow. Therefore, it has become difficult to bring the probe into contact with the conductive pattern with high positional accuracy. If one probe is brought into contact with the two adjacent conductive patterns at the same time, the probe is short-circuited to the other probe having different potential, and the test cannot be properly performed. Particularly, such a problem is noticeable in a case in which the probe needs to be brought into contact with one bonding pad of two bonding pads for obtaining contact with electrodes of the semiconductor light receiving element, and which two bonding pads are disposed side by side.

Advantageous Effects of the Present Disclosure

According to the present disclosure, it is possible to provide an optical semiconductor device and a method of assembling an optical semiconductor device which are capable of preventing a short circuit between probes when testing a semiconductor light receiving element mounted on a carrier.

Description of Embodiments of the Present Disclosure

First, embodiments of the present disclosure will be listed and described. An optical semiconductor device according to an embodiment includes a semiconductor light receiving element, a capacitor, a carrier, a first conductive pattern, a second conductive pattern, and a third conductive pattern. The semiconductor light receiving element has a first electrode and a second electrode which has a conductivity type opposite to that of the first electrode. The capacitor has one electrode and an other electrode. The carrier has a mounting surface on which the semiconductor light receiving element and the capacitor are mounted. The carrier is made of a dielectric. The first conductive pattern, the second conductive pattern, and the third conductive pattern are provided on the mounting surface of the carrier. The first conductive pattern includes a first mounting area which is connected to the first electrode. The first conductive pattern includes a first bonding pad provided on one end of the mounting surface. The second conductive pattern includes a second mounting area which is connected to the second electrode. The second conductive pattern includes a third mounting area which is provided on an other end of the mounting surface and is connected to the one electrode of the capacitor. The third conductive pattern includes a second bonding pad which is provided on the one end of the mounting surface side by side with the first bonding pad. The first conductive pattern, the second conductive pattern, and the third conductive pattern are separated from each other. The other electrode of the capacitor and the third conductive pattern are electrically connected to each other via a wire.

Usually, the semiconductor light receiving element is tested in a state in which the semiconductor light receiving element is mounted on the carrier. In the optical semiconductor device, the first bonding pad is included in the first conductive pattern together with the first mounting area which is connected with the first electrode. The third mounting area is included in the second conductive pattern together with the second mounting area which is connected with the second electrode. Therefore, when the semiconductor light receiving element is tested, one probe may be brought into contact with the first bonding pad, and the other probe may be brought into contact with the second conductive pattern, for example, the third mounting area. Here, the first bonding pad is provided on one end of the mounting surface side by side with the second bonding pad. Therefore, when the probe is brought into contact with the first bonding pad, if positional accuracy of the probe is low, the probe comes in contact with the second bonding pad as well. If the second bonding pad was included in the second conductive pattern, this contact causes a short circuit between the probes.

On the other hand, in the above-described optical semiconductor device, the second conductive pattern including the second mounting area that is connected with the second electrode, and the third conductive pattern including the second bonding pad are separated from each other. Accordingly, even in a case in which the probe that comes in contact with the first bonding pad simultaneously comes in contact with the second bonding pad, it is possible to prevent a short circuit between the probes. Since the second conductive pattern and the third conductive pattern can be connected to each other via the capacitor after the test, there is no problem even if they are separated electrically from each other during the test.

The above-described optical semiconductor device may include a fourth conductive pattern including a third bonding pad provided on the one end of the mounting surface side by side with the first bonding pad and the second bonding pad. The first bonding pad is located between the second bonding pad and the third bonding pad. The fourth conductive pattern is separated from the first conductive pattern, the second conductive pattern, and the third conductive pattern. The other electrode of the capacitor and the fourth conductive pattern are electrically connected to each other via a wire. According to this configuration, a signal path including the third conductive pattern and a signal path including the fourth conductive pattern can be brought close to each other symmetrically with a signal path including the first conductive pattern interposed therebetween. In this case, a signal transfer characteristic can be improved.

In the above-described optical semiconductor device, the third conductive pattern and the fourth conductive pattern may have a line-symmetrical planar shape to each other with the first conductive pattern interposed therebetween. According to this configuration, a signal path including the third conductive pattern and a signal path including the fourth conductive pattern are symmetrical to each other with a signal path including the first conductive pattern interposed therebetween. Therefore, a signal transfer characteristic can be further improved.

In the above-described optical semiconductor device, the third conductive pattern may extend from the second bonding pad along the one end of the mounting surface and further include a third bonding pad which is provided side by side with the first bonding pad. The first bonding pad is located between the second bonding pad and the third bonding pad. In this case, as compared with a case in which the above-described fourth conductive pattern is provided, a lateral width of the mounting surface of the carrier, that is, a width of the mounting surface in a direction along the one end and the other end thereof, can be smaller. This can contribute to reducing the size of the optical semiconductor device. Alternatively, another circuit component can be disposed instead of the fourth conductive pattern.

The above-described optical semiconductor device may include a third bonding pad provided on the one end of the mounting surface side by side with the first bonding pad and the second bonding pad. The first bonding pad is located between the second bonding pad and the third bonding pad. The second bonding pad and the third bonding pad are electrically connected to each other via a conductive film which is provided on a side of the carrier. In this case, as compared with a case in which the above-described fourth conductive pattern is provided, a lateral width of the mounting surface of the carrier, that is, a width of the mounting surface in a direction along the one end and the other end thereof, can be smaller. This can contribute to reducing the size of the optical semiconductor device. Alternatively, another circuit component can be disposed instead of the fourth conductive pattern. Furthermore, in the conductive film on the mounting surface, the portion of the third conductive pattern which connects the second bonding pad to the third bonding pad is not necessary, and thus the mounting surface of the carrier can be made even smaller. Therefore, this can further contribute to reducing the size of the optical semiconductor device.

A method of assembling an optical semiconductor device according to an embodiment includes the steps of: preparing a carrier which has a first conductive pattern, a second conductive pattern, and a third conductive pattern on a mounting surface, the first conductive pattern including a first bonding pad and a first mounting area, the second conductive pattern including a second mounting area and a third mounting area, and in which the first conductive pattern, the second conductive pattern, and the third conductive pattern are separated from each other; mounting a semiconductor light receiving element on the carrier and electrically connecting a first electrode of the semiconductor light receiving element to the first mounting area of the carrier and a second electrode of the semiconductor light receiving element to the second mounting area of the carrier; testing in a state in which one probe is brought into contact with the first bonding pad and an other probe is brought into contact with the second conductive pattern, and a voltage is applied between the one probe and the other probe; mounting a capacitor on the carrier and electrically connecting one electrode of the capacitor to the third mounting area after testing; and wire-bonding between the other electrode of the capacitor and the third conductive pattern using a first wire.

In this assembling method, the semiconductor light receiving element is tested in a state in which the semiconductor light receiving element is mounted on the carrier. At this time, the second conductive pattern including the second mounting area that is connected with the second electrode is separated from the third conductive pattern including the second bonding pad. Accordingly, even in a case in which the probe that comes in contact with the first bonding pad simultaneously comes in contact with the second bonding pad, it is possible to prevent a short circuit between the probes.

Details of Embodiments of the Present Invention

Specific examples of an optical semiconductor device and a method of assembling an optical semiconductor device of the present disclosure will be described below with reference to the drawings. The present invention is not limited to these examples, but is defined by the scope of the claims, and is intended to include meanings equivalent to the scope of the claims and all modifications within the scope. In the following description, the same elements will be denoted by the same reference signs in the description of the drawings, without redundant description.

FIG. 1 is a cross-sectional view showing a configuration of a light receiving module 1A according to an embodiment, and shows a cross section along an optical axis of incident light. The light receiving module 1A constitutes a part of an optical receiver used for long-distance optical communication. As shown in FIG. 1, the light receiving module 1A of the present embodiment includes an optical receptacle 10 which is connected to an optical fiber, and a light receiving unit 20A fixed to the optical receptacle 10. The optical receptacle 10 includes a fiber stub, that is, a stub ferrule 12, a metal member 14, a sleeve 16, and an outer shell member, that is, a shell 18. The fiber stub 12 has a ferrule 11 and an optical fiber 13.

The ferrule 11 is a member having a cylindrical shape or a circular columnar shape. A central axis of the ferrule 11 extends in a direction D1, and a cross section of the ferrule 11 which is perpendicular to the central axis is circular. The ferrule 11 has a base end surface 11a and a tip end surface 11b which are arranged in the direction D1. The tip end surface 11b makes physical contact with a ferrule of an optical connector which is connected to the optical receptacle 10. The tip end surface 11b is polished in a spherical shape, for example. The base end surface 11a is a surface opposite to the tip end surface 11b, and faces the light receiving unit 20A which is attached to the optical receptacle 10. The base end surface 11a is slightly inclined, for example, about 8° with respect to a surface perpendicular to the central axis of the ferrule 11. The ferrule 11 further has an outer peripheral surface 11c which is a circular columnar surface.

The ferrule 11 further has a fiber holding hole 11d. The fiber holding hole 11d extends in the direction D1 and is formed on the central axis of the ferrule 11. A cross section of the fiber holding hole 11d is circular, and its inner diameter is slightly larger than an outer diameter of the optical fiber 13. One opening of the fiber holding hole 11d is included in the tip end surface 11b, and the other opening of the fiber holding hole 11d is included in the base end surface 11a. That is, the fiber holding hole 11d penetrates a space between the base end surface 11a and the tip end surface 11b of the ferrule 11 in the direction D1. The ferrule 11 is made of zirconia ($ZrO_2$), for example. Since the ferrule 11 is made of zirconia having high toughness and Young's modulus, physical contact can be suitably made on the tip end surface 11b.

The optical fiber 13 is a single mode fiber, for example, and is a bare fiber with a resin coating removed. The optical fiber 13 is made of quartz, for example. The optical fiber 13 extends in the direction D1 as a longitudinal direction, that is, an optical axis direction. The optical fiber 13 has one end 13a and another end 13b. The optical fiber 13 is inserted into the fiber holding hole 11d. Then, the one end 13a is exposed from the opening of the fiber holding hole 11d on the tip end surface 11b, and the other end 13b is exposed from the opening of the fiber holding hole 11d on the base end surface 11a. The one end 13a comes in contact with one end of an optical fiber near the optical connector which is connected to the optical receptacle 10. The other end 13b is optically coupled to a photodiode 21 of the light receiving unit 20A which will be described later. The outer diameter of the optical fiber 13 is 125 μm, for example.

The metal member 14 has a through hole 14a extending in the direction D1 and holds the fiber stub 12 in the through hole 14a. The metal member 14 is made of a metal material such as stainless steel, for example. The metal member 14 has a cylindrical shape extending in the direction D1. The metal member 14 has a base end surface 14b, a tip end surface 14c, and an outer peripheral surface 14d. The base end surface 14b and the tip end surface 14c are arranged in the direction D1. The through hole 14a penetrates a space between the base end surface 14b and the tip end surface 14c. A cross section of the through hole 14a which is perpendicular to the direction D1 is circular. The base end surface 14b faces a package 22 of the light receiving unit 20A which will be described later. The fiber stub 12 is press-fitted into the through hole 14a of the metal member 14 in the direction D1. That is, the outer peripheral surface 11c of the ferrule 11 is in contact with an inner surface of the through hole 14a, and thus the fiber stub 12 is fixed to the metal member 14.

A sleeve 16 is a cylindrical member extending in the direction D1 and is made of a ceramic, for example. In one example, the sleeve 16 is made of the same material as the ferrule 11, for example, zirconia. An inner diameter of the sleeve 16 is substantially equal to an outer diameter of the fiber stub 12. The sleeve 16 has a base end 16a and a tip end 16b which are arranged in the direction D1. The sleeve 16 has an outer peripheral surface 16c and an inner peripheral surface 16d. The fiber stub 12 is inserted from an opening of the sleeve 16 on the base end 16a. In other words, a part of the sleeve 16 near the base end 16a is inserted into a gap between the outer peripheral surface 11c of the ferrule 11 and the metal member 14. Therefore, the outer peripheral surface 16c of the sleeve 16 is in contact with the metal member 14, and the inner peripheral surface 16d of the sleeve 16 is in contact with the outer peripheral surface 11c of the ferrule 11. The optical connector ferrule is inserted from the opening of the sleeve 16 on the tip end 16b. The tip end surface 11b of the ferrule 11 and the tip end surface of the optical connector ferrule come in contact with each other in the sleeve 16. Accordingly, the optical fiber 13 held by the ferrule 11 and the optical fiber held by the optical connector ferrule are optically coupled to each other with high coupling efficiency.

The outer shell member 18 is fixed to the metal member 14 and is connected to the optical connector. The outer shell member 18 is a cylindrical member extending in the direction D1 and is made of a metal such as stainless steel, for example. The outer shell member 18 has a flange portion 18a and a through hole 18d extending in the direction D1. The outer shell member 18 has a base end surface 18b and a tip end portion 18c which are arranged in the direction D1. The flange portion 18a is a disk-shaped portion that projects toward the outside of the outer shell member 18. The flange portion 18a is provided near the base end surface 18b of the outer shell member 18. In the present embodiment, one surface of the flange portion 18a constitutes the base end surface 18b. The through hole 18d penetrates a space between the base end surface 18b and the tip end portion 18c. A cross section of the through hole 18d which is perpendicular to the direction D1 is circular, and its central axis overlaps with the central axes of the fiber stub 12 and the metal member 14. The outer shell member 18 includes, as a part of the through hole 18d, a first portion 18e near the base end surface 18b and a second portion 18f near the tip end portion 18c. The first portion 18e extends from the base end surface 18b to the second portion 18f in the direction D1. The second portion 18f extends from the tip end portion 18c to the first portion 18e in the direction D1. The first portion 18e and the second portion 18f are connected to each other, in other words, communicated with each other, between the tip end 16b of the sleeve 16 and the tip end portion 18c. An inner diameter of the first portion 18e is substantially equal to or slightly larger than an outer diameter of the outer peripheral surface 16c of the sleeve 16. An inner diameter of the second portion 18f is slightly larger than an inner diameter of the inner peripheral surface 16d of the sleeve 16. In this way, the inner diameter of the first portion 18e is larger than the inner diameter of the second portion 18f, and thus a step surface 18g is formed between the first portion 18e and the second portion 18f. The step surface 18g faces the tip end 16b of the sleeve 16.

The light receiving unit 20A has an optical semiconductor device 2A, a package 22, a lens 23, a stem 24, an integrated circuit chip 26, and a plurality of lead pins 27a to 27f.

The stem 24 is a substantially circular and flat plate-shaped insulating member. The stem 24 has a flat main surface 24a. The main surface 24a intersects with the optical axis of the optical fiber which is connected to the optical receptacle 10, that is, the optical axis of the optical fiber 13. In one example, the main surface 24a is perpendicular to the optical axis of the optical fiber which is connected to the optical receptacle 10, that is, the optical axis of the optical fiber 13. The stem 24 is made of a material such as a ceramic, for example.

The package 22 is a substantially cylindrical metal member, and its central axis is along the optical axis of the optical fiber 13. One end 22a of the package 22 on a base end side in the optical axis direction of the optical fiber 13 is fixed to the main surface 24a of the stem 24 via an annular member 29. Specifically, the annular member 29 has one end surface 29a and another end surface 29b in the optical axis direction. The one end 22a of the package 22 on the base end side is bonded to the one end surface 29a of the annular member 29, and the main surface 24a of the stem 24 is fixed to the other end surface 29b of the annular member 29. The other end 22b of the package 22 on a tip end side in the optical axis direction of the optical fiber 13 is fixed to the metal member 14 via a cylindrical member 19. Specifically, the metal member 14 is inserted from one end of the cylindrical member 19 on a tip end side, and the outer peripheral surface of the metal member 14 and an inner peripheral surface of the cylindrical member 19 are bonded to each other. The other end 22b of the package 22 on the tip end side is bonded to a surface of the cylindrical member 19 on a base end side. The package 22 is made of a material such as an iron-nickel alloy, for example.

The optical semiconductor device 2A has a carrier 25 and a photodiode 21 mounted on the carrier 25. The photodiode 21 is an example of a semiconductor light receiving element in the present disclosure. The photodiode 21 is optically coupled to the other end 13b of the optical fiber 13. The photodiode 21 receives light from the optical fiber which is connected to the optical receptacle 10, and outputs a current signal having a magnitude corresponding to the intensity of the light. The photodiode 21 is mounted on the carrier 25 mainly containing a dielectric, and the carrier 25 is disposed on the integrated circuit chip 26. That is, the photodiode 21 is mounted on the integrated circuit chip 26 via the carrier 25. The carrier 25 is made of a dielectric only in one example. As the photodiode 21, various photodiodes such as a PIN photodiode and an avalanche photodiode (APD) can be applied. The carrier 25 is a flat plate member made of a ceramic or quartz, for example. The integrated circuit chip 26 is a semiconductor IC that receives a current signal from the photodiode 21 and converts the current signal into a voltage signal.

The plurality of lead pins 27 are rod-shaped metal members extending in a direction intersecting with the main surface 24a of the stem 24. The lead pins 27 are provided to penetrate the stem 24 and are fixed to the stem 24. Through the lead pins 27, an electric signal and electric power are sent to and received from the photodiode 21 and the integrated circuit chip 26 which are disposed in a space defined by the package 22, the stem 24, and the member 29.

The lens 23 is held inside the package 22 and is fixed to an inner peripheral surface of the package 22 via a resin 23a. The lens 23 is a condenser lens made of a light transmitting member, and is disposed on the optical axis of the optical fiber 13. The lens 23 focuses the light emitted from the other end 13b of the optical fiber 13 toward the photodiode 21. The optical axis of the lens 23 is slightly offset with respect to the optical axis of the optical fiber 13 to prevent return light from the photodiode 21.

Figure 2:
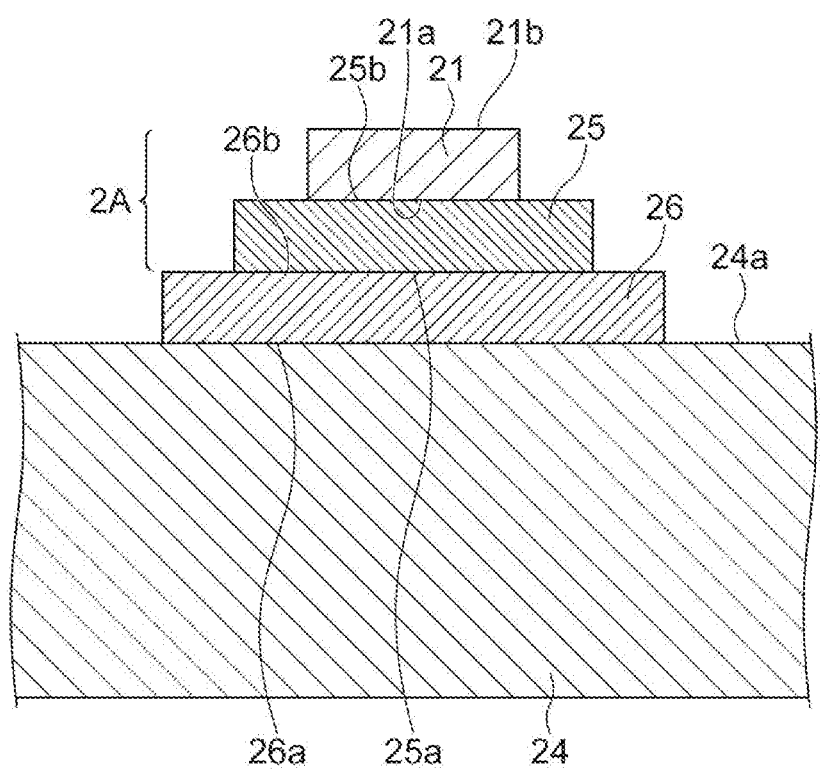
FIG. 2 is an enlarged cross-sectional view showing a configuration of a light receiving unit in the vicinity of an optical semiconductor device.

FIG. 2 is an enlarged cross-sectional view showing a configuration of the light receiving unit 2A in the vicinity of the optical semiconductor device 20A. As shown in FIG. 2, the integrated circuit chip 26 has a surface 26a and a surface 26b opposite to the surface 26a. The surfaces 26a and 26b are arranged in the optical axis direction of the optical fiber 13 and extend along a plane intersecting with (for example, orthogonal to) the optical axis direction. The surface 26a of the integrated circuit chip 26 faces the main surface 24a of the stem 24. The carrier 25 has a surface 25a and a mounting surface 25b opposite to the surface 25a. The surface 25a of the carrier 25 faces the surface 26b of the integrated circuit chip 26. The photodiode 21 has a main surface 21a and a back surface 21b opposite to the main surface 21a, and receives light on the back surface 21b. The photodiode 21 is mounted on the mounting surface 25b of the carrier 25 so that the mounting surface 25b faces the main surface 21a of the photodiode 21.

Figure 3:
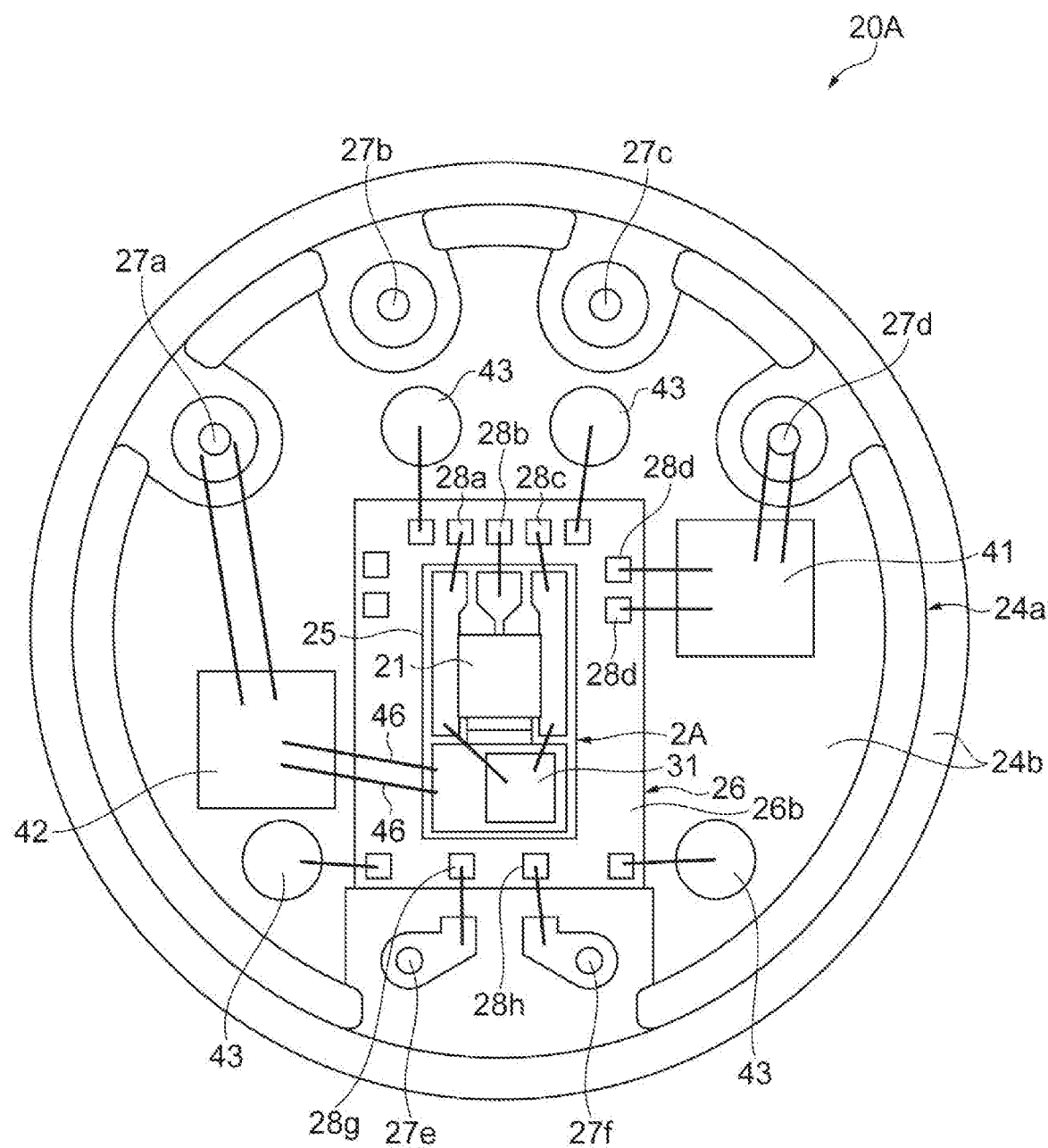
FIG. 3 is a plan view of the light receiving unit with a package and a lens removed.

FIG. 3 is a plan view of the light receiving unit 20A with the package 22 and the lens 23 removed. As shown in FIG. 3, a GND pattern 24b which is regulated to a reference potential, that is, a ground potential, is provided on the main surface 24a of the stem 24. The lead pins 27a to 27f are provided on a peripheral portion of the stem 24.

The surface 26b of the integrated circuit chip 26 has a rectangular shape. The surface 26b has a pair of sides extending in a lateral direction of the integrated circuit chip 26, that is, short sides, and a pair of sides extending in a longitudinal direction of the integrated circuit chip 26, that is, long sides. The integrated circuit chip 26 has a plurality of electrode pads on the surface 26b. In these electrode pads, three electrode pads 28a to 28c arranged along one short side are electrically connected to the photodiode 21. Specifically, two electrode pads 28a and 28c are connected to a cathode electrode of the photodiode 21 via a capacitor 31. The electrode pad 28b is connected to an anode electrode of the photodiode 21 and receives a current signal output from the photodiode 21.

Two electrode pads 28d are located near one of the long sides of the surface 26b. A power supply voltage to the integrated circuit chip 26 is input from the outside of the light receiving module 1A through the electrode pads 28d. As shown in FIG. 3, electrode pads 28d are electrically connected to one electrode of the capacitor 41 mounted on the GND pattern 24b via a bonding wire. The one electrode of the capacitor 41 is further electrically connected to the lead pin 27d via a bonding wire. The other electrode of the capacitor 41 is electrically connected to the GND pattern 24b via a conductive bonding material such as solder. The capacitor 41 functions as a bypass capacitor. The capacitor 41 is a chip capacitor, for example.

The electrode pads 28g and 28h are arranged along the other short side of the surface 26b. The voltage signal generated based on the current signal from the photodiode 21 is output to the outside of the light receiving module 1A through the electrode pads 28g and 28h. As shown in FIG. 3, one electrode pad 28g is electrically connected to the lead pin 27e via a bonding wire. The other electrode pad 28h is electrically connected to another lead pin 27f via a bonding wire.

Figure 4:
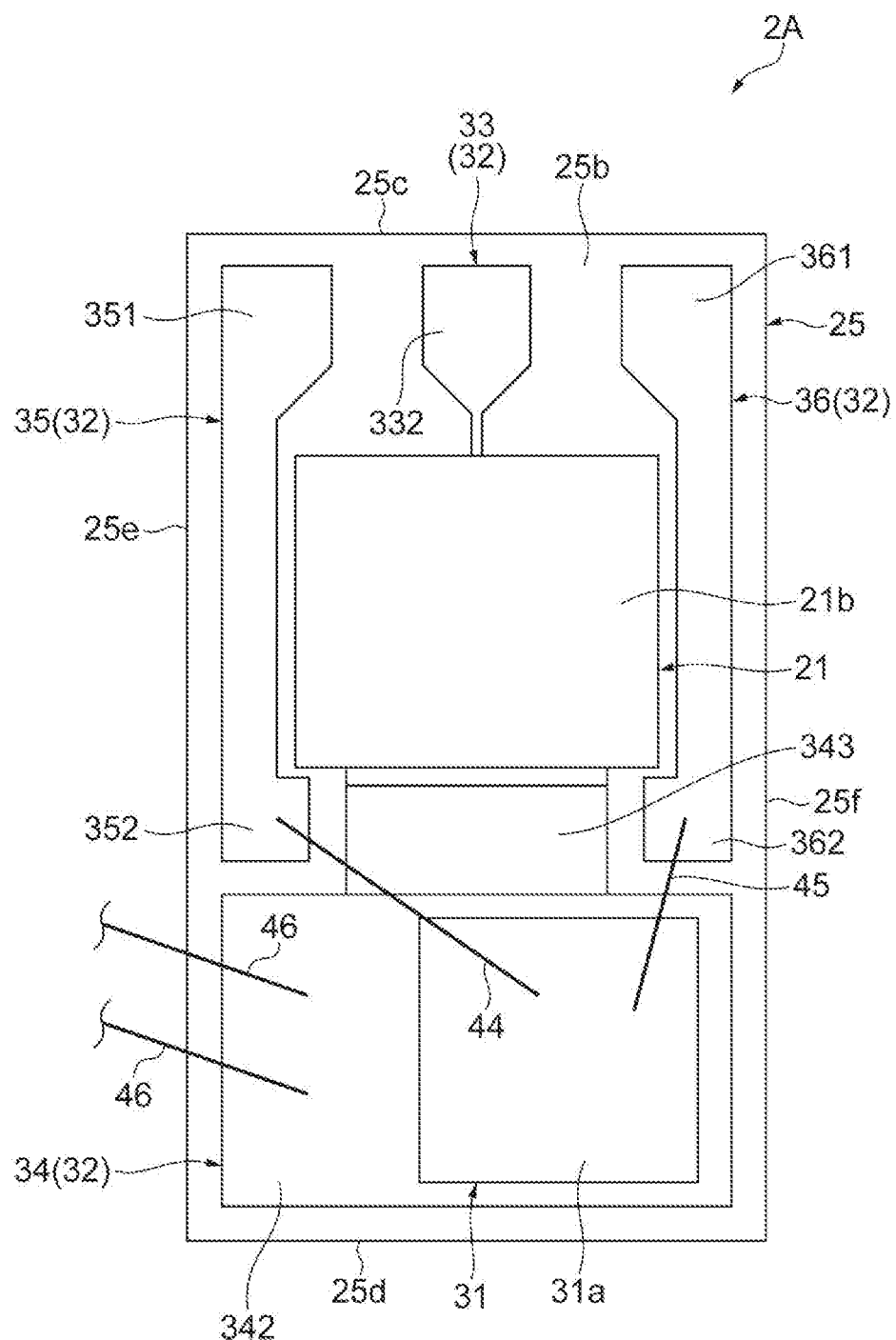
FIG. 4 is an enlarged plan view showing the optical semiconductor device.

FIG. 4 is an enlarged plan view showing the optical semiconductor device 2A. The mounting surface 25b of the carrier 25 has a rectangular shape. The mounting surface 25b has a pair of sides extending in a lateral direction, that is, short sides 25c and 25d, and a pair of sides extending in a longitudinal direction, that is, long sides 25e and 25f. As shown in FIG. 3, the longitudinal direction of the carrier 25 coincides with the longitudinal direction of the integrated circuit chip 26. The area of the mounting surface 25b of the carrier 25 is equal to or more than half the area of the surface 26b of the integrated circuit chip 26. In one example, the length of the carrier 25 in the longitudinal direction is 760 μm, and the length of the carrier 25 in the lateral direction is 530 μm.

The optical semiconductor device 2A further includes a capacitor 31 in addition to the carrier 25 and the photodiode 21. The capacitor 31 is mounted on the mounting surface 25b of the carrier 25 together with the photodiode 21. Specifically, the photodiode 21 is disposed at a position near the short side 25c in the longitudinal direction of the mounting surface 25b. The capacitor 31 is disposed at a position near the short side 25d in the longitudinal direction of the mounting surface 25b, that is, between the photodiode 21 and the short side 25d. The capacitor 31 has a pair of electrodes facing opposite directions, and a dielectric such as SiN, for example, interposed between the pair of electrodes. Hereinafter, one electrode of the capacitor 31 will be referred to as a back surface electrode, and the other electrode will be referred to as a front surface electrode 31a. The back surface electrode of the capacitor 31 faces the mounting surface 25b. The front surface electrode 31a of the capacitor 31 faces the same direction as the mounting surface 25b. The capacitance value of the capacitor 31 is 100 pF, for example. The planar shape of the capacitor 31 is a square having a side of 250 μm, for example.

Figure 5:
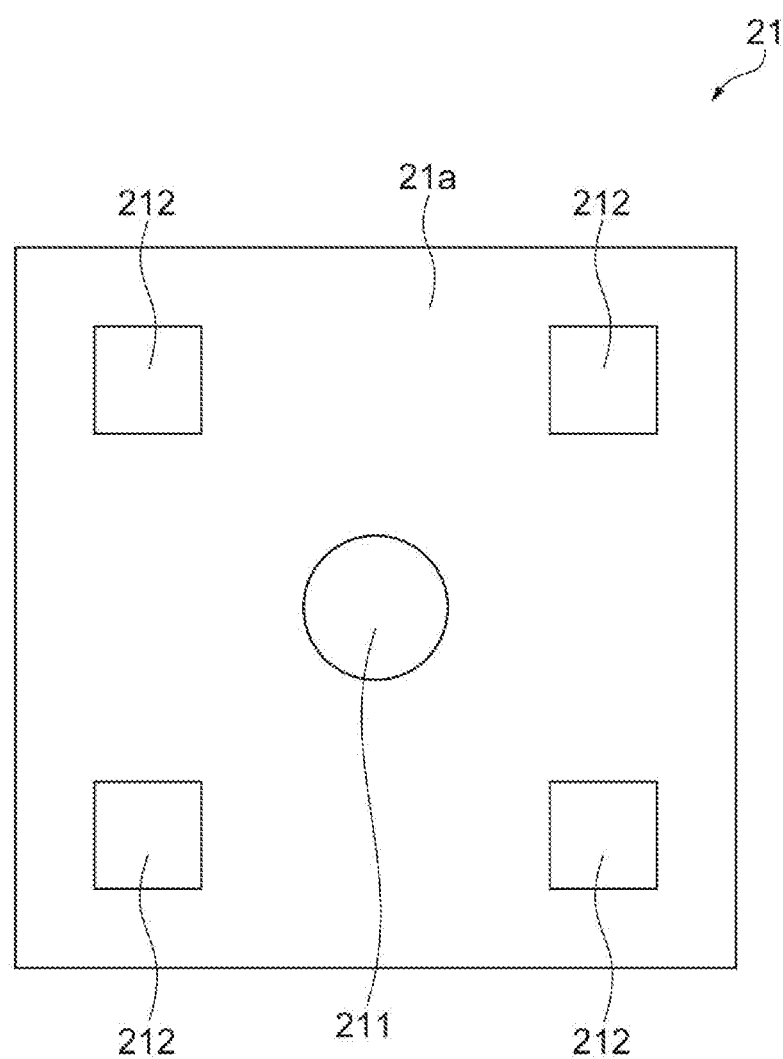
FIG. 5 is a plan view showing a main surface of a photodiode.

FIG. 5 is a plan view showing the main surface 21a of the photodiode 21. The planar shape of the main surface 21a is rectangular or square. The photodiode 21 has a first electrode 211 and a second electrode 212 having a conductivity type opposite to that of the first electrode 211 on the main surface 21a. For example, the first electrode 211 is an anode electrode and the second electrode 212 is a cathode electrode. In one example, the first electrode 211 is disposed at the center of the main surface 21a of the photodiode 21. The second electrode 212 is disposed at each of four corners of the main surface 21a of the photodiode 21. The dimension of the main surface 21a is about 300 μm on a side, for example.

FIG. 6 is a plan view of the mounting surface 25b of the carrier 25. In FIG. 6, areas A1 to A3 are indicated by a broken line. The area A1 is an area to which the first electrode 211 of the photodiode 21 is connected by conductive junction. The area A2 is an area to which the second electrode 212 is connected by conductive junction. The area A3 is an area to which the back surface electrode of the capacitor 31 is connected by conductive junction.

As shown in FIG. 6, a conductive film 32 is provided on the mounting surface 25b of the carrier 25. The conductive film 32 is a metal film fixed to the mounting surface 25b. The conductive film 32 mainly includes a gold (Au) film based on titanium (Ti), for example. The conductive film 32 includes a first conductive pattern 33, a second conductive pattern 34, a third conductive pattern 35, and a fourth conductive pattern 36. These conductive patterns 33 to 36 are separated from each other on the mounting surface 25b. The conductive patterns separated from each other means that the conductive patterns are spaced from each other via air or an insulating material and the conductive patterns are electrically isolated from each other in a structure including the carrier 25 and the conductive film 32.

The first conductive pattern 33 is a wiring pattern extending in the longitudinal direction of the mounting surface 25b. The first conductive pattern 33 is provided at a position in a central portion of the mounting surface 25b in the lateral direction and near the short side 25c. The first conductive pattern 33 includes a first mounting area 331 and a first bonding pad 332. The first mounting area 331 is a circular pattern that constitutes one end portion of the first conductive pattern 33 near the short side 25d. The first mounting area 331 is connected with the first electrode 211 of the photodiode 21 by conductive junction using a conductive bonding material such as AuSn solder. The first bonding pad 332 is a polygonal pattern provided on one end of the mounting surface 25b. The first bonding pad 332 is provided between the short side 25c and the first mounting area 331. The first bonding pad 332 constitutes the other end portion of the first conductive pattern 33 near the short side 25c. One end of a bonding wire extending from the electrode pad 28b of the integrated circuit chip 26 shown in FIG. 3 is connected to the first bonding pad 332.

The second conductive pattern 34 is a wiring pattern extending in the longitudinal direction of the mounting surface 25b. The second conductive pattern 34 is provided at a position in a central portion of the mounting surface 25b in the lateral direction and near the short side 25d. The second conductive pattern 34 includes a second mounting area 341, a third mounting area 342, and a flow stop area 343. The second mounting area 341 is a U-shaped pattern that constitutes one end portion of the second conductive pattern 34 near the short side 25c. The second mounting area 341 is connected with the four second electrodes 212 of the photodiode 21 by conductive junction using a conductive bonding material such as AuSn solder. The first mounting area 331 of the first conductive pattern 33 is disposed in a void in the center of the second mounting area 341.

The third mounting area 342 is a rectangular pattern provided on the other end of the mounting surface 25b. The third mounting area 342 is provided between the short side 25d and the second mounting area 341. The third mounting area 342 constitutes the other end portion of the second conductive pattern 34 near the short side 25d. The third mounting area 342 is connected with the back surface electrode of the capacitor 31 by conductive junction using a conductive bonding material such as AuSn solder. The flow stop area 343 is provided between the second mounting area 341 and the third mounting area 342, and physically isolates these areas 341 and 342 from each other. The flow stop area 343 suppresses the inflow of the conductive bonding material from the second mounting area 341 to the third mounting area 342 and the inflow of the conductive bonding material from the third mounting area 342 to the second mounting area 341. The flow stop area 343 is a film having a surface made of a material which has a lower wettability with respect to the conductive bonding material than those of the areas 341 and 342. The surface of the flow stop area 343 is made of chromium (Cr), for example.

The area A3 is connected with the back surface electrode of the capacitor 31 by conductive junction. The area A3 is provided at a position near the long side 25f in the third mounting area 342. As shown in FIG. 4, one end of a bonding wire 46 is joined to a portion of the third mounting area 342 near the long side 25e. Referring to FIG. 3 again, the other end of the bonding wire 46 is joined to one electrode of a capacitor 42 installed on the GND pattern 24b. That is, the third mounting area 342 is electrically connected to the one electrode of the capacitor 42 via the bonding wire 46. The one electrode of the capacitor 42 is further electrically connected to the lead pin 27a via a bonding wire. The other electrode of the capacitor 42 is electrically connected to the GND pattern 24b via a conductive bonding material such as solder. The capacitor 42 functions as a bypass capacitor. The capacitor 42 is a chip capacitor, for example.

FIG. 6 is referred to again. The third conductive pattern 35 is a wiring pattern extending in the longitudinal direction of the mounting surface 25b. The third conductive pattern 35 is provided on a portion of the mounting surface 25b near the short side 25c and near the long side 25e. The third conductive pattern 35 includes a second bonding pad 351 and a fourth bonding pad 352. The second bonding pad 351 constitutes one end portion of the third conductive pattern 35 near the short side 25c. One end of a bonding wire extending from the electrode pad 28a of the integrated circuit chip 26 shown in FIG. 3 is connected to the second bonding pad 351. The fourth bonding pad 352 constitutes the other end portion of the third conductive pattern 35 near the short side 25d. The fourth bonding pad 352 is electrically connected to the front surface electrode 31a of the capacitor 31 by a bonding wire 44 shown in FIG. 4. That is, one end of the bonding wire 44 is joined to the fourth bonding pad 352. The other end of the bonding wire 44 is joined to the front surface electrode 31a.

The fourth conductive pattern 36 is a wiring pattern extending in the longitudinal direction of the mounting surface 25b. The fourth conductive pattern 36 is provided on a portion of the mounting surface 25b near the short side 25c and near the long side 25f. The fourth conductive pattern 36 includes a third bonding pad 361 and a fifth bonding pad 362. The third bonding pad 361 constitutes one end portion of the fourth conductive pattern 36 near the short side 25c. One end of a bonding wire extending from the electrode pad 28c of the integrated circuit chip 26 shown in FIG. 3 is connected to the third bonding pad 361. The fifth bonding pad 362 constitutes the other end portion of the fourth conductive pattern 36 near the short side 25d. The fifth bonding pad 362 is electrically connected to the front surface electrode 31a of the capacitor 31 by a bonding wire 45 shown in FIG. 4. That is, one end of the bonding wire 45 is joined to the fifth bonding pad 362. The other end of the bonding wire 45 is joined to the front surface electrode 31a.

The second bonding pad 351, the first bonding pad 332, and the third bonding pad 361 are disposed on one end of the mounting surface 25b side by side in this order. That is, the first bonding pad 332 is located between the second bonding pad 351 and the third bonding pad 361 which are arranged along the short side 25c.

The third conductive pattern 35 and the fourth conductive pattern 36 have a line-symmetrical planar shape to each other with the first conductive pattern 33 interposed therebetween. Specifically, a distance from a center line of the first conductive pattern 33 to the third conductive pattern 35 is equal to a distance from the same center line to the fourth conductive pattern 36, and the planar shape of the third conductive pattern 35 is an inverted shape of the planar shape of the fourth conductive pattern 36. The first conductive pattern 33 is located between the third conductive pattern 35 and the fourth conductive pattern 36 in the lateral direction of the mounting surface 25b. The second mounting area 341 of the second conductive pattern 34 is also located between the third conductive pattern 35 and the fourth conductive pattern 36 in the lateral direction of the mounting surface 25b.

The operation of the light receiving unit 20A of the present embodiment having the above configuration will be described. During the operation of the light receiving unit 20A, the power supply voltage for driving the integrated circuit chip 26 is applied to the electrode pad 28d of the integrated circuit chip 26 from the lead pin 27d via the bonding wire. The magnitude of this power supply voltage is 3.3 V, for example. The noise included in this power supply voltage is removed through the capacitor 41. A bias voltage for driving the photodiode 21 is applied to the third mounting area 342 of the second conductive pattern 34 from the lead pin 27a via the bonding wire 46. The magnitude of this bias voltage is 20 V, for example. The noise included in this bias voltage is removed through the capacitor 42.

The bias voltage provided to the third mounting area 342 is applied to the second electrode 212 of the photodiode 21 through the second conductive pattern 34. In this state, when light is incident on the back surface 21b of the photodiode 21, a current is generated inside the photodiode 21. This current is output from the first electrode 211 of the photodiode 21 and reaches the first bonding pad 332 through the first conductive pattern 33. Then, this current is input to the electrode pad 28b of the integrated circuit chip 26 through the bonding wire. At that time, a return current having the same magnitude as this current returns from the electrode pads 28a and 28c of the integrated circuit chip 26 to the third conductive pattern 35 and the fourth conductive pattern 36 through the bonding wires. The return current is absorbed by the photodiode 21 through the second electrode 212, the capacitor 31 and the second conductive pattern 34. A path from the electrode pads 28a and 28c to the second electrode 212 is called a return path. The capacitor 31 prevents the bias voltage (for example, 20 V) to the photodiode 21 from being applied to the integrated circuit chip 26 having a withstand voltage of about 3 V, for example, via this return path. The integrated circuit chip 26 generates a voltage signal according to the magnitude of the current input to the electrode pad 28b. The voltage signal is output from the electrode pads 28g and 28h of the integrated circuit chip 26 to the outside of the light receiving unit 20A through the lead pins 27e and 27f.

Figure 7A:
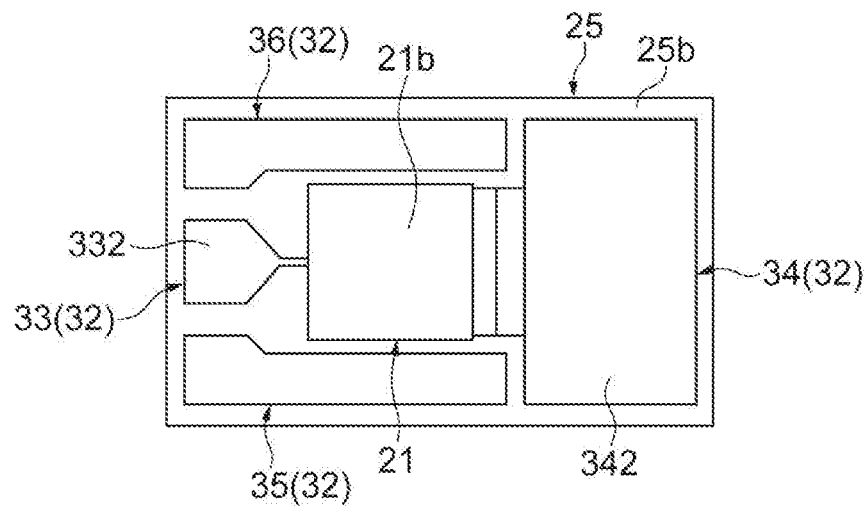
FIG. 7A is a view showing a method of assembling the optical semiconductor device of the embodiment.

A method of assembling the optical semiconductor device 2A of the present embodiment will be described with reference to FIGS. 7A to 7C and FIG. 8. First, the carrier 25 having the conductive film 32 on the mounting surface 25b is prepared. Next, as shown in FIG. 7A, to mount the photodiode 21 on the mounting surface 25b, the first electrode 211 of the photodiode 21 is connected to the first mounting area 331 by conductive junction and the second electrode 212 of the photodiode 21 are connected to the second mounting area 341 by conductive junction.

Figure 7B:
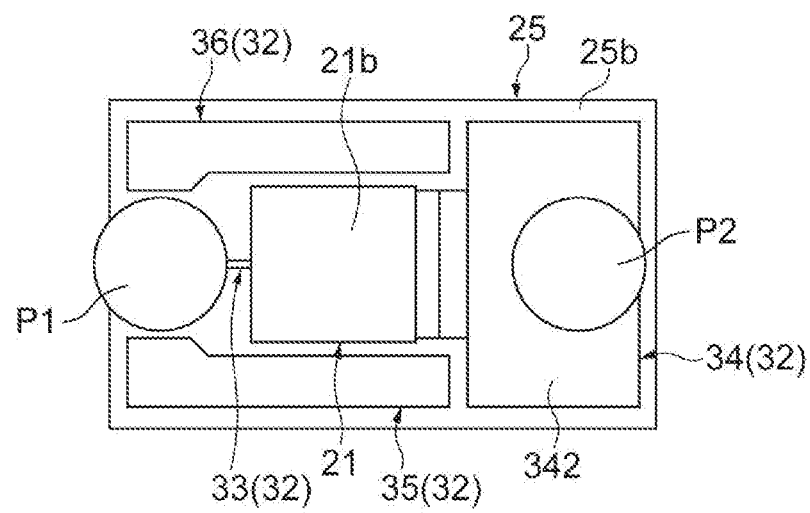
FIG. 7B is a view showing the method of assembling the optical semiconductor device of the embodiment.

Subsequently, as shown in FIG. 7B, a probe P1 is brought into contact with the first bonding pad 332, and another probe P2 is brought into contact with the second conductive pattern 34. More specifically, the probe P2 is brought into contact with the third mounting area 342 of the second conductive pattern 34. The probes P1 and P2 are each connected to a test apparatus. Then, a test such as burn-in of the photodiode 21 is performed in a state in which a voltage is applied between the probe P1 and the probe P2. The burn-in is also called an aging test, and is a test for finding a device with initial failure by applying a load such as a voltage and a temperature to the device. An energization condition in burn-in of APD is, for example, a temperature of 250° C., a time of 24 hours, and a current of 120 µA.

Figure 9A:
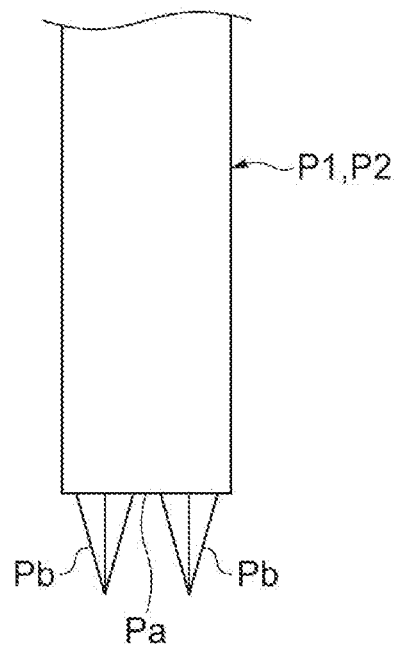
FIG. 9A is a side view showing a tip end shape of a probe used in the embodiment.
Figure 9B:
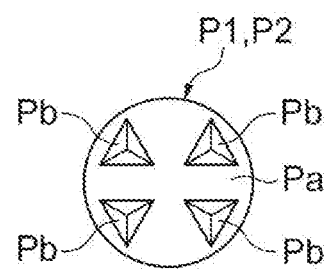
FIG. 9B is a front view showing the tip end shape of the probe used in the embodiment.

FIGS. 9A and 9B are views showing a tip end shape of the probes P1 and P2 used in the present embodiment. FIG. 9A is a side view of the probes P1 and P2. FIG. 9B is a front view of the probes P1 and P2. The probes P1 and P2 have a circular columnar appearance, and have a circular flat end surface Pa at one end thereof in an axial direction. A plurality of (four in the figure) triangular pyramidal protrusions Pb are arranged in a peripheral direction of the end surface Pa and protrude from the end surface Pa. A diameter of the end surface Pa is 0.2 mm, for example.

Figure 10A:
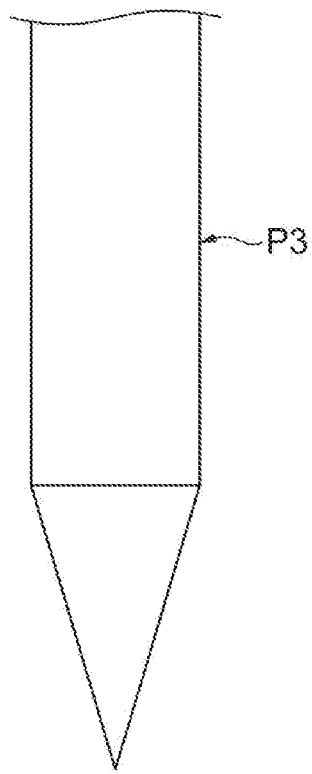
FIG. 10A is a side view showing a tip end shape of a probe of a comparative example.
Figure 10B:
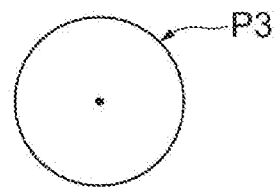
FIG. 10B is a front view showing the tip end shape of the probe of a comparative example.

FIGS. 10A and 10B are views showing a tip end shape of a probe P3 as a comparative example. FIG. 10A is a side view of the probe P3. FIG. 10B is a front view of the probe P3. The probe P3 has a circular columnar appearance, and one end portion thereof in the axial direction is sharpened in a conical shape. Then, a conical tip end portion is brought into contact with the conductive pattern to conduct between the test apparatus and the conductive pattern. However, such a tip end shape of the probe P3 has a problem that it is difficult to make sufficient contact with the conductive pattern. On the other hand, according to the tip end shapes of the probes P1 and P2 shown in FIGS. 9A and 9B, since a contact area of the tip end is increased, a contact property with the conductive pattern can be improved.

Figure 7C:
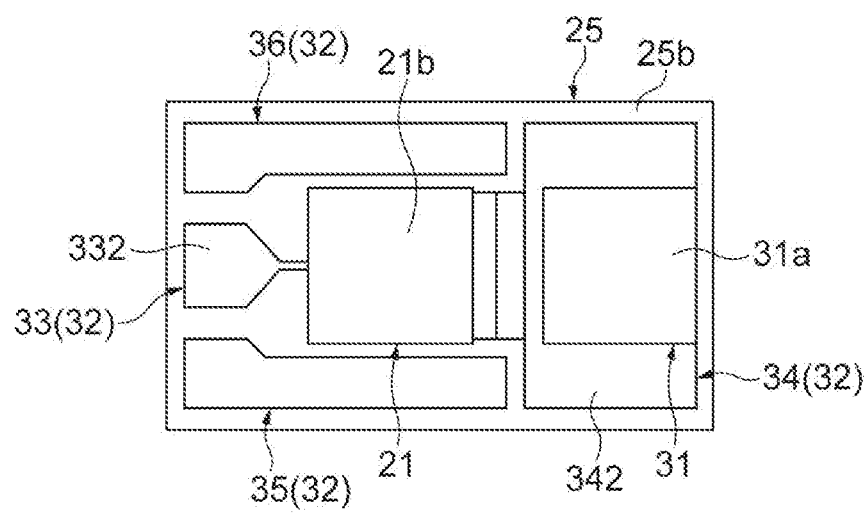
FIG. 7C is a view showing the method of assembling the optical semiconductor device of the embodiment.
Figure 8:
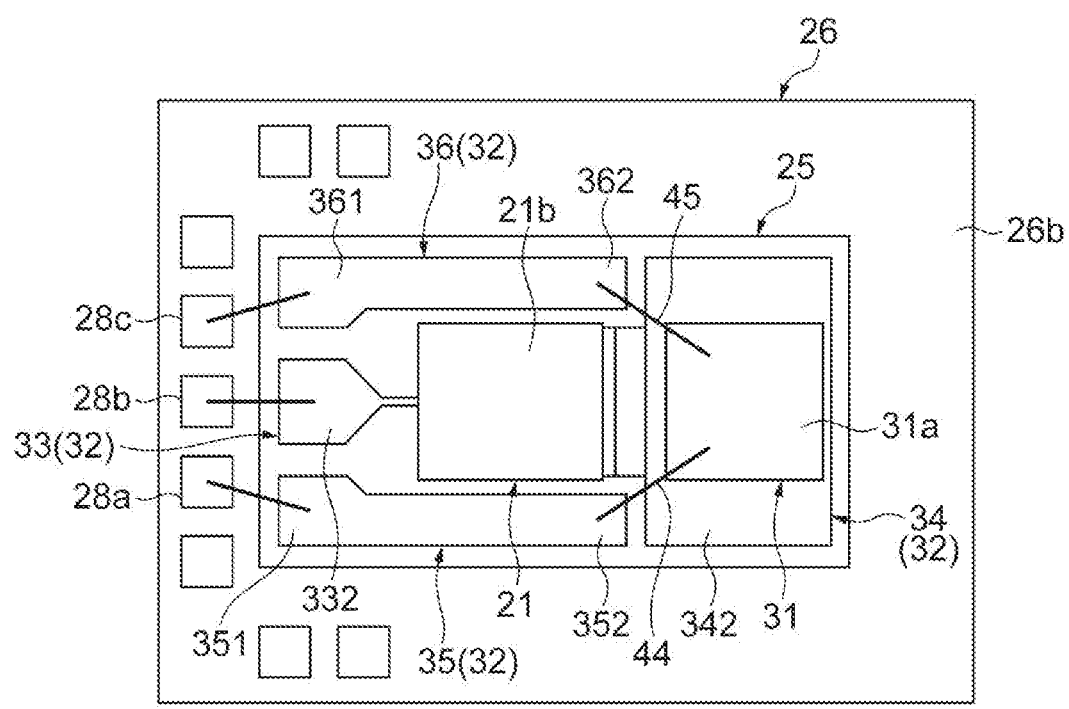
FIG. 8 is a view showing the method of assembling the optical semiconductor device of the embodiment.

FIGS. 7A to 7C and FIG. 8 are referred to again. Subsequently, as shown in FIG. 7C, to mount the capacitor 31 on the mounting surface 25b, the back surface electrode of the capacitor 31 is connected to the third mounting area 342 by conductive junction. Then, as shown in FIG. 8, the carrier 25 is put on the surface 26b of the integrated circuit chip 26. Then, the front surface electrode 31a of the capacitor 31 is electrically connected to the fourth bonding pad 352 by the bonding wire 44, and the front surface electrode 31a is electrically connected to the fifth bonding pad 362 by the bonding wire 45. Before or after that, the second bonding pad 351 is electrically connected to the electrode pads 28a by a bonding wire, the first bonding pad 332 is electrically connected to the electrode pads 28b by a bonding wire, and the third bonding pad 361 is electrically connected to the electrode pad 28c by a bonding wire. The connections by the bonding wires 44 and 45 may be performed before putting the carrier 25 on the integrated circuit chip 26.

Figure 11:
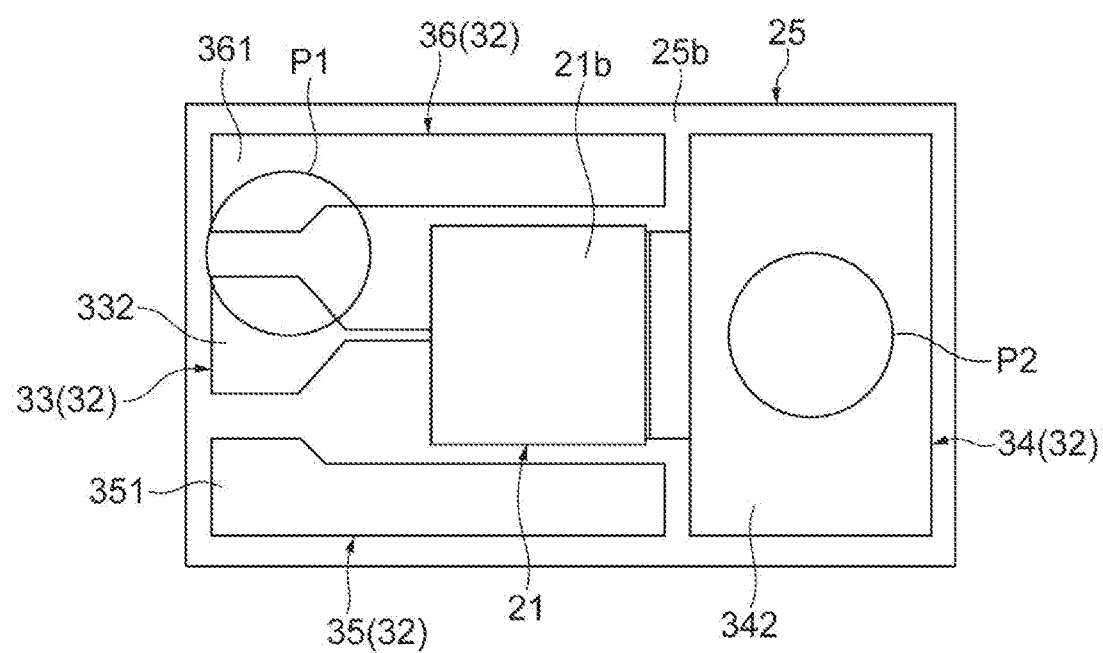
FIG. 11 is a view showing a state in which the probe is in contact with a second bonding pad or a third bonding pad.

The effects obtained by the optical semiconductor device 2A according to the present embodiment described above will be described. Usually, the photodiode 21 is tested in a state in which the photodiode 21 is mounted on the carrier 25. In the optical semiconductor device 2A of the present embodiment, the first bonding pad 332 is included in the first conductive pattern 33 together with the first mounting area 331 which is connected with the first electrode 211. The third mounting area 342 is included in the second conductive pattern 34 together with the second mounting area 341 which is connected with the second electrode 212. Therefore, when the photodiode 21 is tested, as shown in FIG. 7B, one probe P1 may be brought into contact with the first bonding pad 332, and the other probe P2 may be brought into contact with the second conductive pattern 34, for example, the third mounting area 342. However, the first bonding pad 332 is provided side by side with the second bonding pad 351 and the third bonding pad 361 along the short side 25c of the mounting surface 25b. Therefore, when the probe P1 is brought into contact with the first bonding pad 332, if positional accuracy of the probe P1 is low, as shown in FIG. 11, the probe P1 comes in contact with the second bonding pad 351 or the third bonding pad 361 as well. Particularly, in a case of a probe shape of the present embodiment shown in FIGS. 9A and 9B, such a phenomenon is likely to occur because the contact area is wider than in a probe shape shown in FIGS. 10A and 10B. If the second bonding pad 351 or the third bonding pad 361 was included in the second conductive pattern 34, this contact causes a short circuit between the probes P1 and P2.

On the other hand, in the optical semiconductor device 2A of the present embodiment, the second conductive pattern 34 including the second mounting area 341 that is connected with the second electrode 212, the third conductive pattern 35 including the second bonding pad 351, and the fourth conductive pattern 36 including the third bonding pad 361 are separated from each other. Accordingly, even in a case in which the probe P1 that comes in contact with the first bonding pad 332 simultaneously comes in contact with the second bonding pad 351 or the third bonding pad 361, it is possible to prevent a short circuit between the probes P1 and P2. Since the second conductive pattern 34 and the third conductive pattern 35 can be connected to each other via the capacitor 31 after the test, there is no problem even if they are separated electrically from each other during the test.

As in the present embodiment, the conductive film 32 may include the fourth conductive pattern 36. The fourth conductive pattern 36 includes the third bonding pad 361 provided side by side with the first bonding pad 332 and the second bonding pad 351 along the short side 25c of the mounting surface 25b. The first bonding pad 332 is located between the second bonding pad 351 and the third bonding pad 361. The fourth conductive pattern 36 is separated from the first conductive pattern 33, the second conductive pattern 34, and the third conductive pattern 35. The front surface electrode 31a of the capacitor 31 is electrically connected to the fourth conductive pattern 36 via the bonding wire 45. According to this configuration, a signal path including the third conductive pattern 35 and a signal path including the fourth conductive pattern 36 can be brought close to each other symmetrically with a signal path including the first conductive pattern interposed therebetween. In this case, a signal transfer characteristic can be improved. In addition, since the first bonding pad 332 is located substantially at the center of the mounting surface 25b in the lateral direction, the probe P1 can be reliably brought into contact with the first bonding pad 332 even in a case in which a relative position of the carrier 25 and the probe P1 in the same direction is significantly deviated.

As in the present embodiment, the third conductive pattern 35 and the fourth conductive pattern 36 may have a line-symmetrical planar shape to each other with the first conductive pattern 33 interposed therebetween. According to this configuration, a signal path including the third conductive pattern 35 and a signal path including the fourth conductive pattern 36 are symmetrical to each other with a signal path including the first conductive pattern 33 interposed therebetween. Therefore, a signal transfer characteristic can be further improved.

In the method of assembling the optical semiconductor device 2A according to the present embodiment, the photodiode 21 is tested in a state in which the photodiode 21 is mounted on the carrier 25. At this time, the second conductive pattern 34 including the second mounting area 341 that is connected with the second electrode 212, and the third conductive pattern 35 including the second bonding pad 351 and the fourth conductive pattern 36 including the third bonding pad 361 are separated electrically from each other. Accordingly, even in a case in which the probe P1 that comes in contact with the first bonding pad 332 simultaneously comes in contact with the second bonding pad 351 or the third bonding pad 361, it is possible to prevent a short circuit between the probes P1 and P2.

First Modification Example

Figure 12:
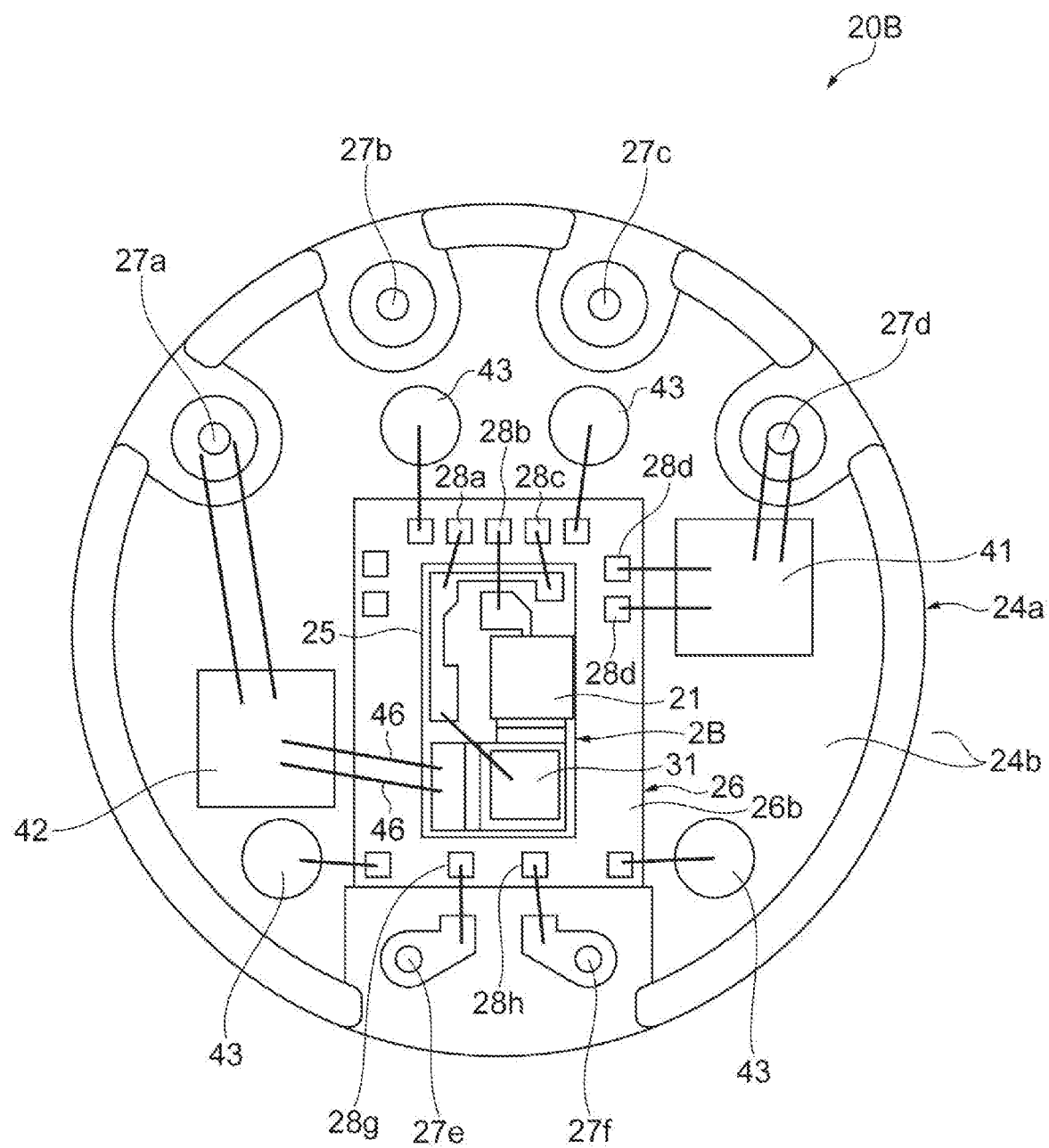
FIG. 12 is a plan view showing a light receiving unit according to a first modification example.
Figure 13:
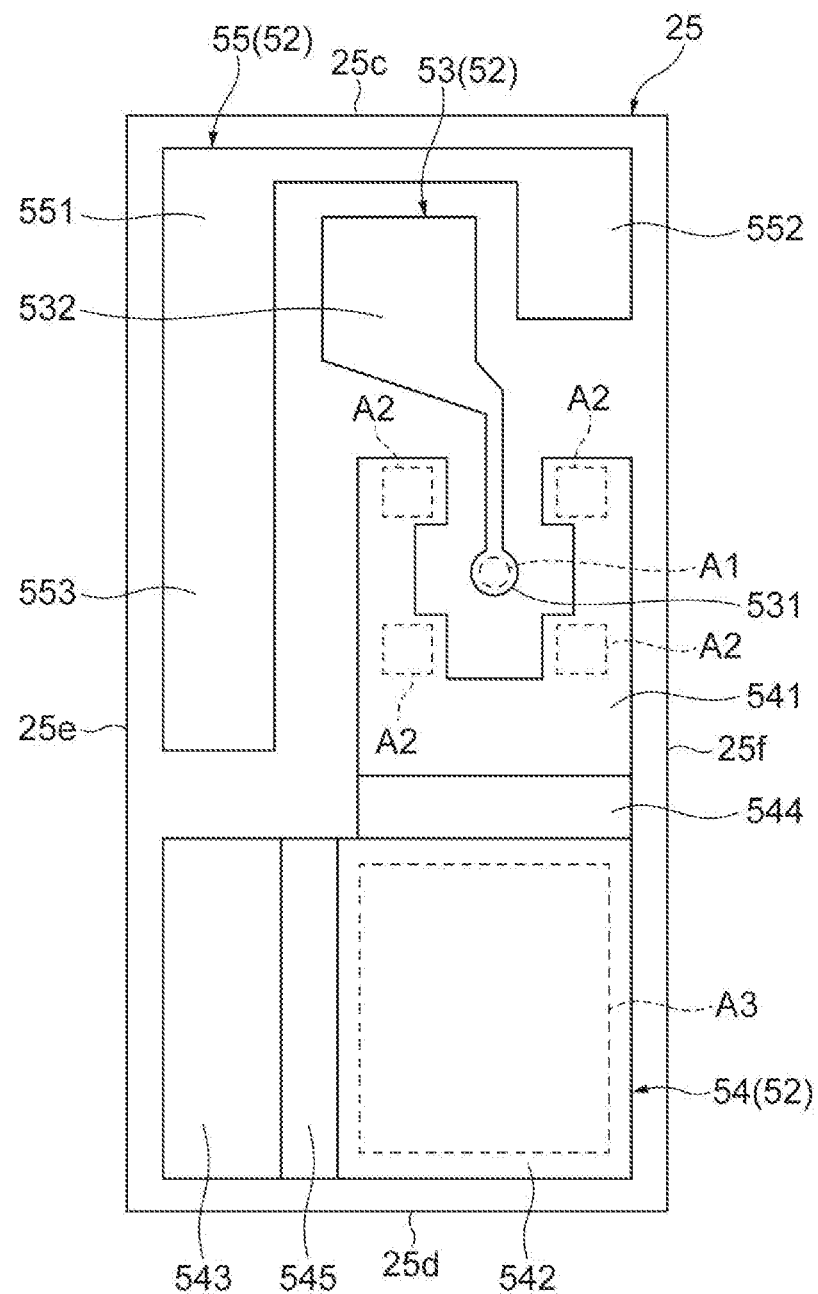
FIG. 13 is an enlarged plan view showing the mounting surface of the carrier shown in FIG. 12.

FIG. 12 is a plan view showing a light receiving unit 20B according to a first modification example of the above-described embodiment. The light receiving unit 20B includes an optical semiconductor device 2B. In the light receiving unit 20B and the optical semiconductor device 2B, the configuration other than the shape of the conductive film on the carrier 25 is the same as that of the above-described embodiment. FIG. 13 is an enlarged plan view showing the mounting surface 25b of the carrier 25 shown in FIG. 12. In FIG. 13, the areas A1 to A3 are indicated by a broken line. The area A1 is an area to which the first electrode 211 of the photodiode 21 is connected by conductive junction. The area A2 is an area to which the second electrode 212 is connected by conductive junction. The area A3 is an area to which the back surface electrode of the capacitor 31 is connected by conductive junction.

As shown in FIG. 13, instead of the conductive film 32 of the above-described embodiment, a conductive film 52 is provided on the mounting surface 25b of the carrier 25. The conductive film 52 is a metal film fixed to the mounting surface 25b. The constituent material of the conductive film 52 is the same as that of the conductive film 32 of the above-described embodiment. The conductive film 52 includes a first conductive pattern 53, a second conductive pattern 54, and a third conductive pattern 55. These conductive patterns 53 to 55 are separated from each other on the mounting surface 25b.

The first conductive pattern 53 is a wiring pattern extending in the longitudinal direction of the mounting surface 25b. The first conductive pattern 53 is provided at a position in a central portion of the mounting surface 25b in the lateral direction and near the short side 25c. The first conductive pattern 53 includes a first mounting area 531 and a first bonding pad 532. The first mounting area 531 is a circular pattern that constitutes one end portion of the first conductive pattern 53 near the short side 25d. The first mounting area 531 is connected with the first electrode 211 of the photodiode 21 by conductive junction using a conductive bonding material such as AuSn solder. The first bonding pad 532 is a rectangular pattern provided on one end of the mounting surface 25b. The first bonding pad 532 is provided between the short side 25c and the first mounting area 531. The first bonding pad 532 constitutes the other end portion of the first conductive pattern 53 near the short side 25c. One end of a bonding wire extending from the electrode pad 28b of the integrated circuit chip 26 shown in FIG. 12 is connected to the first bonding pad 532.

The second conductive pattern 54 is a wiring pattern extending in an L shape in the longitudinal direction and then the lateral direction of the mounting surface 25b. The second conductive pattern 54 includes a second mounting area 541, a third mounting area 542, a bonding pad 543, and flow stop areas 544 and 545.

The second mounting area 541 is a U-shaped pattern that constitutes one end portion of the second conductive pattern 54 near the short side 25c, and is provided at a position near the long side 25f of the mounting surface 25b in the lateral direction. The second mounting area 541 is connected with the four second electrodes 212 of the photodiode 21 by conductive junction using a conductive bonding material such as AuSn solder. The first mounting area 531 of the first conductive pattern 53 is provided in a void in the center of the second mounting area 541.

The third mounting area 542 is a square pattern provided on the other end of the mounting surface 25b. The third mounting area 542 is provided between the short side 25d and the second mounting area 541. The third mounting area 542 is connected with the back surface electrode of the capacitor 31 by conductive junction using a conductive bonding material such as AuSn solder. One end of the bonding wire 46 shown in FIG. 12 is joined to the bonding pad 543. That is, the bonding pad 543 is electrically connected to the one electrode of the capacitor 42 via the bonding wire 46. The bonding pad 543 is provided between the long side 25e and the third mounting area 542. That is, the bonding pad 543 is provided at a position near the short side 25d and near the long side 25e of the mounting surface 25b.

The flow stop area 544 is provided between the second mounting area 541 and the third mounting area 542, and physically isolates these areas 541 and 542 from each other. The flow stop area 544 suppresses the inflow of the conductive bonding material from the second mounting area 541 to the third mounting area 542 and the inflow of the conductive bonding material from the third mounting area 542 to the second mounting area 541. The flow stop area 545 is provided between the third mounting area 542 and the bonding pad 543, and physically isolates the third mounting area 542 and the bonding pad 543 from each other. The flow stop area 545 suppresses the inflow of the conductive bonding material from the third mounting area 542 to the bonding pad 543. The flow stop areas 544 and 545 are a film having a surface made of a material which has a lower wettability with respect to the conductive bonding material than those of the areas 541 and 542 and the bonding pad 543. The surfaces of the flow stop areas 544 and 545 are made of chromium (Cr), for example.

The third conductive pattern 55 is a wiring pattern extending in an L shape in the longitudinal direction and then the lateral direction of the mounting surface 25b, and includes a portion extending along the short side 25c of the mounting surface 25b and a portion extending along the long side 25e of the mounting surface 25b. In these portions, the portion extending along the long side 25e includes a second bonding pad 551 and a fourth bonding pad 553. The second bonding pad 551 constitutes one end portion of the above-described portion of the third conductive pattern 55 near the short side 25c. One end of a bonding wire extending from the electrode pad 28a of the integrated circuit chip 26 shown in FIG. 12 is connected to the second bonding pad 551. The fourth bonding pad 553 constitutes the other end portion of the above-described portion of the third conductive pattern 55 near the short side 25d. The fourth bonding pad 553 is electrically connected to the front surface electrode 31a of the capacitor 31 by a bonding wire.

The third conductive pattern 55 further includes a third bonding pad 552 extending from the second bonding pad 551 along the short side 25c of the mounting surface 25b. The third bonding pad 552 is a square pattern provided between the long side 25f and the second bonding pad 551. The third conductive pattern 55 is provided at a position near the short side 25c and near the long side 25f. A portion of the third conductive pattern 55 which extends along the short side 25c is provided between the first bonding pad 532 of the first conductive pattern 53 and the short side 25c. This portion extends in the lateral direction of the mounting surface 25b from the second bonding pad 551 to the third bonding pad 552. That is, the second bonding pad 551 forms one end of the above-described portion of the third conductive pattern 55. The third bonding pad 552 forms the other end of the above-described portion of the third conductive pattern 55.

The second bonding pad 551, the first bonding pad 532, and the third bonding pad 552 are provided and arranged along the short side 25c of the mounting surface 25b side by side in this order. That is, the first bonding pad 532 is located between the second bonding pad 551 and the third bonding pad 552 in the lateral direction of the mounting surface 25b. One end of a bonding wire extending from the electrode pad 28c of the integrated circuit chip 26 shown in FIG. 12 is connected to the third bonding pad 552.

As in the present modification example, the third conductive pattern 55 may include the third bonding pad 552 provided side by side with the first bonding pad 532 and the second bonding pad 551 along the short side 25c of the mounting surface 25b. The first bonding pad 532 is located between the second bonding pad 551 and the third bonding pad 552. In this case, as compared with a case in which the fourth conductive pattern 36 is provided as in the above-described embodiment, a width of the mounting surface 25b of the carrier 25 in the lateral direction, that is, a width of the mounting surface 25b in a direction along the short sides 25c and 25d can be made smaller. Therefore, this can contribute to reducing the size of the optical semiconductor device. Alternatively, another circuit component can be disposed instead of the fourth conductive pattern 36.

Second Modification Example

Figure 14:
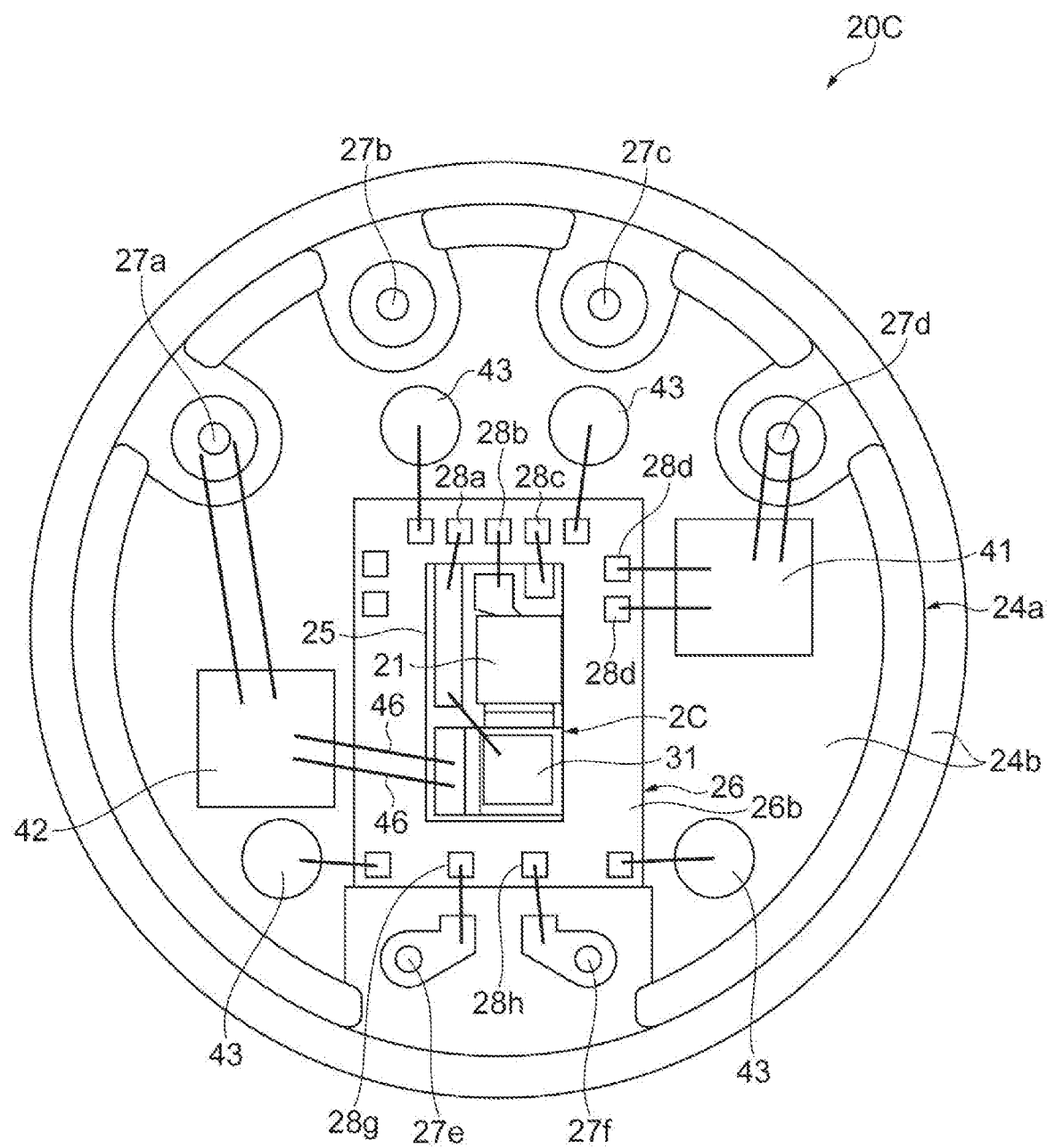
FIG. 14 is a plan view showing a light receiving unit according to a second modification example.

FIG. 14 is a plan view showing a light receiving unit 20C according to a second modification example of the above-described embodiment. The light receiving unit 20C includes an optical semiconductor device 2C. In the light receiving unit 20C and the optical semiconductor device 2C, the configuration other than the shape of the conductive film on the carrier 25 is the same as that of the above-described embodiment. The shape of the conductive film on the carrier 25 is the same as that of the first modification example except for the part that will be described below.

Figure 15:
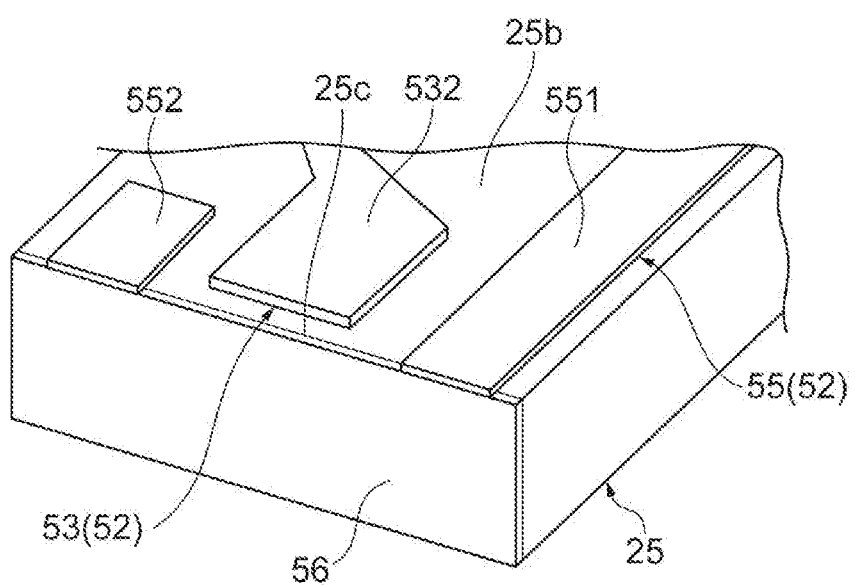
FIG. 15 is an enlarged perspective view showing a configuration in the vicinity of a short side of the carrier shown in FIG. 14.

FIG. 15 is an enlarged perspective view showing a configuration in the vicinity of the short side 25c of the carrier 25 shown in FIG. 14. Similar to the first modification example, a conductive film 52 of the present modification example includes a third bonding pad 552 provided side by side with a first bonding pad 532 and a second bonding pad 551 along the short side 25c of the mounting surface 25b. The first bonding pad 532 is located between the second bonding pad 551 and the third bonding pad 552. However, a third conductive pattern 55 on the mounting surface 25b does not have a portion extending along the short side 25c. Instead, a conductive film 56 is provided on a side surface of the carrier 25 which includes the short side 25c. The conductive film 56 is a metal film fixed to the side surface of the carrier 25, and is made of, for example, the same material as the conductive film 32. The conductive film 56 extends over the entire side surface of the carrier 25. The conductive film 56 is in contact with the second bonding pad 551 and the third bonding pad 552 on the short side 25c. Accordingly, the second bonding pad 551 is electrically connected to the third bonding pad 552 via the conductive film 56.

According to the present modification example, similar to the first modification example, a width of the mounting surface 25b of the carrier 25 in the lateral direction can be made smaller as compared with a case in which the fourth conductive pattern 36 is provided as in the above-described embodiment. Therefore, this can contribute to reducing the size of the optical semiconductor device. Alternatively, another circuit component can be disposed instead of the fourth conductive pattern 36. Furthermore, in the conductive film 52 on the mounting surface 25b, the portion of the third conductive pattern 55 which connects the second bonding pad 551 and the third bonding pad 552 to each other is not necessary, and thus the mounting surface 25b of the carrier 25 can be made further smaller. Therefore, this can further contribute to reducing the size of the optical semiconductor device. It is also possible to electrically connect the third conductive pattern 55 to the electrode pads 28a and 28c of the integrated circuit chip 26 via the conductive film 56. In that case, the number of wires on the mounting surface 25b can be reduced.

Comparative Example

Figure 16:
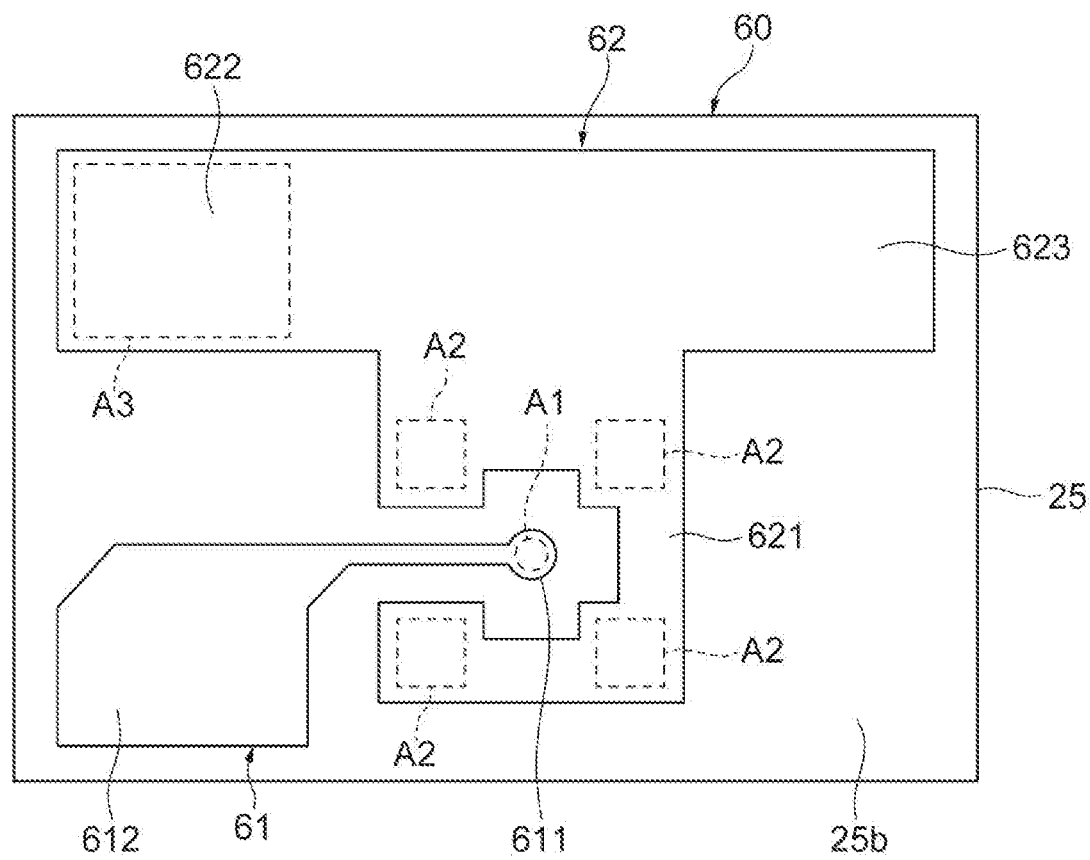
FIG. 16 is a plan view showing a shape of a conductive film according to a comparative example provided on the mounting surface of the carrier.

FIG. 16 is a plan view showing a shape of a conductive film 60 according to a comparative example provided on the mounting surface 25b of the carrier 25. The conductive film 60 has a first conductive pattern 61 and a second conductive pattern 62 that are provided apart from each other. The first conductive pattern 61 includes a first mounting area 611 and a first bonding pad 612. The first mounting area 611 constitutes one end portion of the first conductive pattern 61, and is connected to the first electrode 211 of the photodiode 21 by conductive junction using a conductive bonding material such as AuSn solder. The first bonding pad 612 constitutes the other end portion of the first conductive pattern 61. One end of a bonding wire extending from the electrode pad 28b of the integrated circuit chip 26 is connected to the first bonding pad 612.

The second conductive pattern 62 includes a second mounting area 621, a third mounting area 622, and a probe contact pad 623. The second mounting area 621 is a U-shaped pattern provided on a substantially central portion of the mounting surface 25b. The second mounting area 621 is connected to the four second electrodes 212 of the photodiode 21 by conductive junction using a conductive bonding material such as AuSn solder. The first mounting area 611 of the first conductive pattern 61 is disposed in a void in the center of the second mounting area 621. The third mounting area 622 is provided side by side with the first bonding pad 612 along one end side of the mounting surface 25b. The third mounting area 622 is connected with the back surface electrode of the capacitor 31 by conductive junction using a conductive bonding material such as AuSn solder. The probe contact pad 623 is provided on the other end of the mounting surface 25b. The probe contact pad 623 is an area for bringing the probe into contact therewith during the test.

Figure 17:
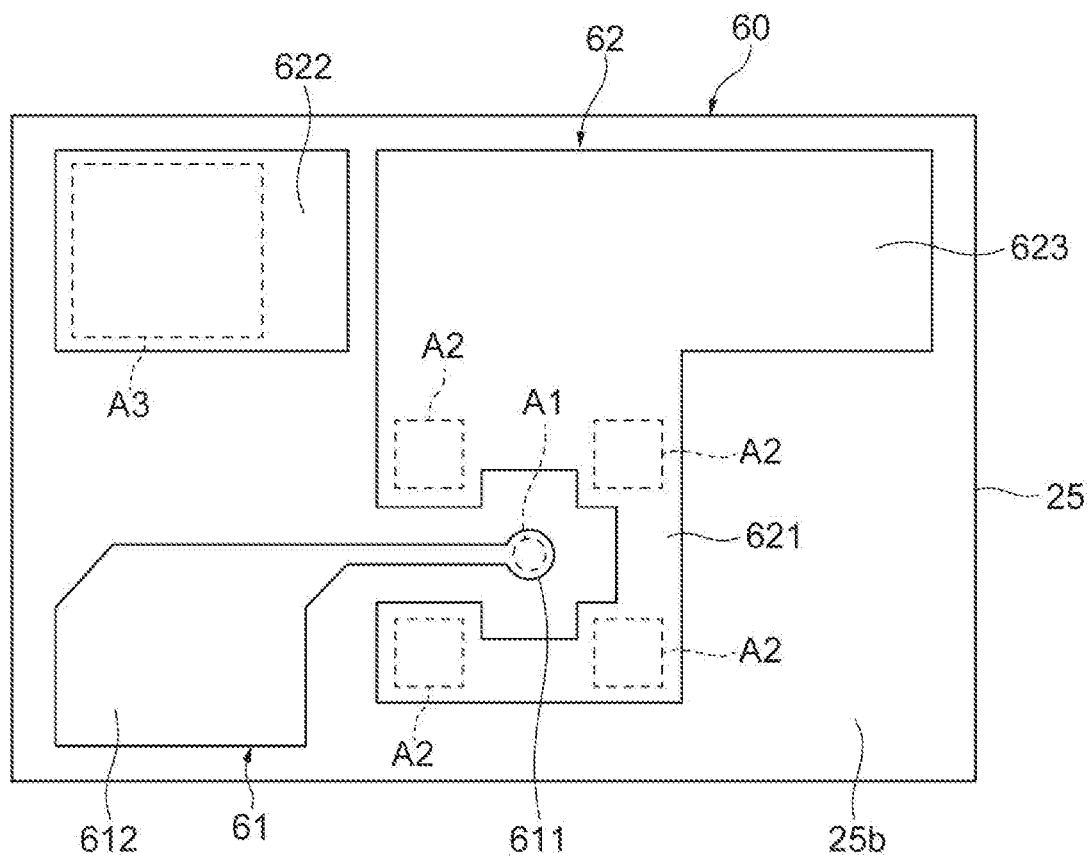
FIG. 17 is a view showing a configuration in which a third mounting area is isolated from a second mounting area and a probe contact pad.

In this comparative example, when the photodiode 21 is tested, one probe is brought into contact with the first bonding pad 612 and the other probe is brought into contact with the probe contact pad 623 diagonally located with respect to the first bonding pad 612. At that time, if positional accuracy of the probe is low, the one probe may come in contact with the third mounting area 622 as well. In that case, the probes having different potentials are short-circuited to each other, and the test cannot be properly performed. Therefore, as shown in FIG. 17, it may be considered to isolate the third mounting area 622 from the second mounting area 621 and the probe contact pad 623. Accordingly, even in a case in which the one probe comes in contact with the third mounting area 622, it is possible to prevent a short circuit between the probes.

Figure 18A:
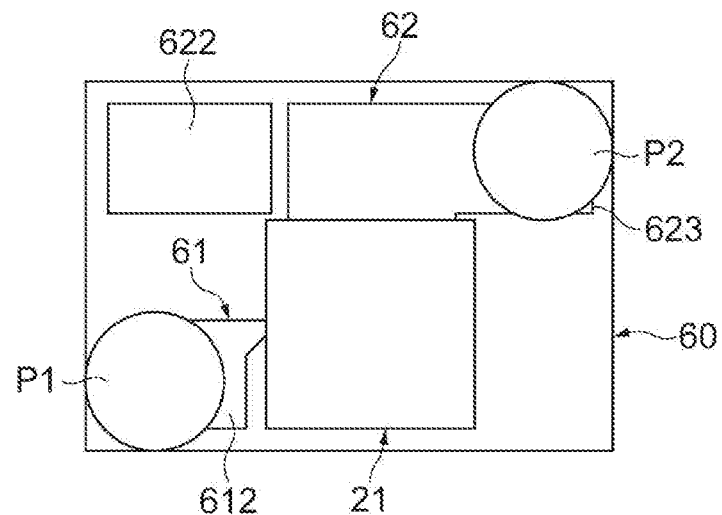
FIG. 18A is a view showing an assembly process of an optical semiconductor device according to a comparative example.
Figure 18B:
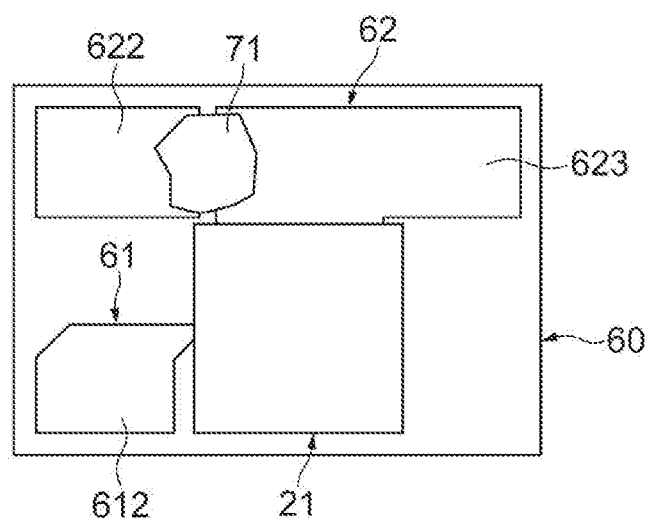
FIG. 18B is a view showing an assembly process of the optical semiconductor device according to the comparative example.
Figure 18C:
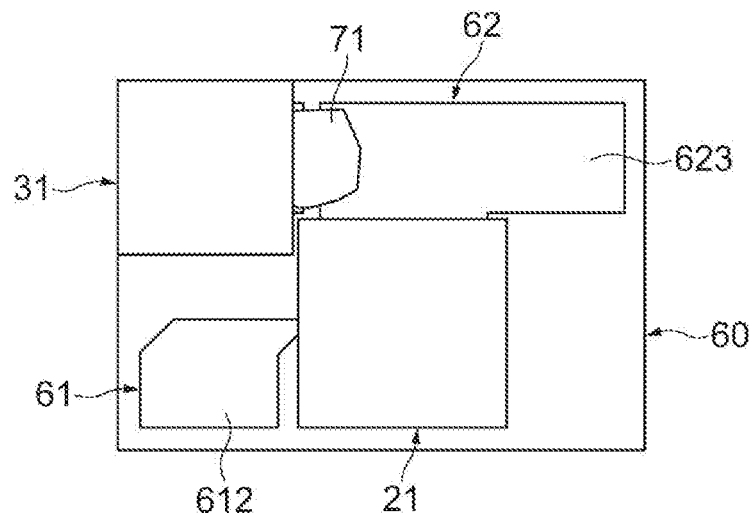
FIG. 18C is a view showing an assembly process of the optical semiconductor device according to the comparative example.
Figure 19:
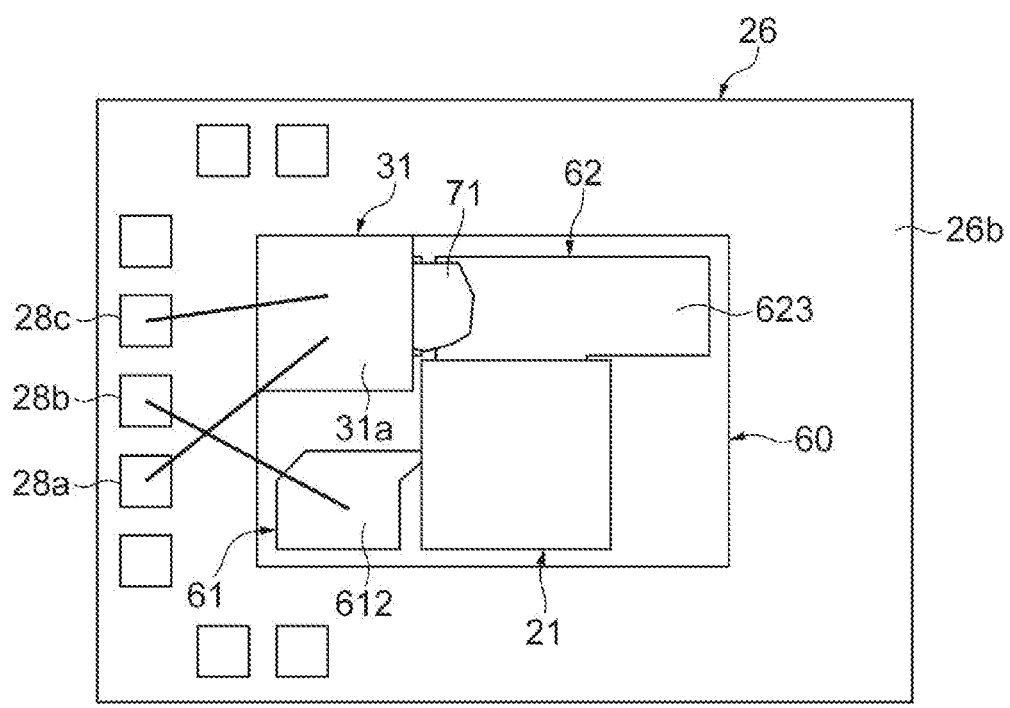
FIG. 19 is a view showing an assembly process of the optical semiconductor device according to the comparative example.

FIGS. 18A to 18C and FIG. 19 are views showing an assembly process of the optical semiconductor device according to the comparative example. First, as shown in FIG. 18A, in a state in which the photodiode 21 is mounted on the mounting surface 25b, the probe P1 is brought into contact with the first bonding pad 612 and the probe P2 is brought into contact with the probe contact pad 623. The probes P1 and P2 are each connected to a test apparatus. Then, a test such as burn-in is performed in a state in which a voltage is applied between the probe P1 and the probe P2. Next, as shown in FIG. 18B, the second mounting area 621 is electrically connected to the third mounting area 622 using a conductive resin 71 or the like, for example. Instead of the conductive resin 71, solder or wire-bonding may be used. Subsequently, as shown in FIG. 18C, the capacitor 31 is mounted on the third mounting area 622. Finally, as shown in FIG. 19, wire-bonding is performed between the electrode pad 28b of the integrated circuit chip 26 and the first bonding pad 612. Further, wire-bonding is performed between the electrode pad 28a of the integrated circuit chip 26 and the front surface electrode 31a of the capacitor 31, and between the electrode pad 28c of the integrated circuit chip 26 and the front surface electrode 31a of the capacitor 31.

However, the optical semiconductor device according to this comparative example has the following problems. First, the third mounting area 622 is narrowed due to the conductive resin 71 or the like. Therefore, in the process shown in FIG. 18C, the area on which the capacitor 31 is mounted is limited, and a degree of freedom in selecting the capacitor 31 is reduced. In a case in which the second mounting area 621 is connected to the third mounting area 622 using wire-bonding, the capacitor 31 is mounted in the area adjacent to the wire, and the wire may be cut when the capacitor is mounted.

To solve these problems, in the above-described embodiment and each modification example, the area on which the capacitor 31 is mounted is positioned near the short side 25d on the side opposite to the second bonding pad 351 and the third bonding pad 361. Accordingly, a mounting area of the capacitor 31 is not limited, and the degree of freedom in selecting the capacitor 31 is not reduced. Since the area on which the capacitor 31 is mounted is not adjacent to the wire, there is no possibility of cutting the wire when the capacitor 31 is mounted.

The optical semiconductor device and the method of assembling an optical semiconductor device according to the present disclosure are not limited to the above-described embodiment, and various modifications can be made. For example, in the above-described embodiment and each modification example, the case in which the optical semiconductor device of the present disclosure is applied to the light receiving module for the optical communication is illustrated, but the optical semiconductor device of the present disclosure can be applied to various modules other than this.

What is claimed is:

1. An optical semiconductor device comprising:
a semiconductor light receiving element having a first electrode and a second electrode which has a conductivity type opposite to that of the first electrode;
a capacitor having one electrode and an other electrode;
a carrier having a mounting surface on which the semiconductor light receiving element and the capacitor are mounted, and made of a dielectric; and
a first conductive pattern, a second conductive pattern, and a third conductive pattern provided on the mounting surface of the carrier,
wherein the first conductive pattern includes a first mounting area which is connected to the first electrode,
wherein the first conductive pattern includes a first bonding pad provided on one end of the mounting surface,
wherein the second conductive pattern includes a second mounting area which is connected to the second electrode,
wherein the second conductive pattern includes a third mounting area which is provided on an other end of the mounting surface and is connected to the one electrode of the capacitor,
wherein the third conductive pattern includes a second bonding pad which is provided on the one end of the mounting surface side by side with the first bonding pad,
wherein the first conductive pattern, the second conductive pattern, and the third conductive pattern are separated from each other, and
wherein the other electrode of the capacitor and the third conductive pattern are electrically connected to each other via a wire.

2. The optical semiconductor device according to claim 1, further comprising:
a fourth conductive pattern including a third bonding pad provided on the one end of the mounting surface side by side with the first bonding pad and the second bonding pad,
wherein the first bonding pad is located between the second bonding pad and the third bonding pad,
wherein the fourth conductive pattern is separated from the first conductive pattern, the second conductive pattern, and the third conductive pattern, and
wherein the other electrode of the capacitor and the fourth conductive pattern are electrically connected to each other via a wire.

3. The optical semiconductor device according to claim 2, wherein the third conductive pattern and the fourth conductive pattern have a line-symmetrical planar shape to each other with the first conductive pattern interposed therebetween.

4. The optical semiconductor device according to claim 1,
wherein the third conductive pattern extends from the second bonding pad along the one end of the mounting surface and further includes a third bonding pad which is provided side by side with the first bonding pad, and
wherein the first bonding pad is located between the second bonding pad and the third bonding pad.

5. The optical semiconductor device according to claim 1, further comprising:
a third bonding pad provided on the one end of the mounting surface side by side with the first bonding pad and the second bonding pad,
wherein the first bonding pad is located between the second bonding pad and the third bonding pad, and
wherein the second bonding pad and the third bonding pad are electrically connected to each other via a conductive film which is provided on a side of the carrier.

* * * * *